(12) United States Patent
Kawato et al.

(10) Patent No.: US 8,658,545 B2
(45) Date of Patent: Feb. 25, 2014

(54) VAPOR DEPOSITION DEVICE, VAPOR DEPOSITION METHOD AND ORGANIC EL DISPLAY DEVICE

(75) Inventors: Shinichi Kawato, Osaka (JP); Satoshi Inoue, Osaka (JP); Tohru Sonoda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/989,704

(22) PCT Filed: Dec. 15, 2011

(86) PCT No.: PCT/JP2011/079059
§ 371 (c)(1),
(2), (4) Date: May 24, 2013

(87) PCT Pub. No.: WO2012/090717
PCT Pub. Date: Jul. 5, 2012

(65) Prior Publication Data
US 2013/0252364 A1  Sep. 26, 2013

(30) Foreign Application Priority Data

Dec. 27, 2010 (JP) .................................. 2010-290149

(51) Int. Cl.
*H01L 21/31* (2006.01)
*H01L 21/469* (2006.01)
*C23C 16/00* (2006.01)

(52) U.S. Cl.
USPC .................... 438/758; 427/255.28; 118/720

(58) Field of Classification Search
USPC .................. 438/758; 427/255.28; 118/720
See application file for complete search history.

(56) References Cited

U.S. PATENT DOCUMENTS

| 6,294,892 B1 | 9/2001 | Utsugi et al. |
| 8,313,806 B2 * | 11/2012 | Matsuura ................. 427/255.28 |
| 2004/0115338 A1 | 6/2004 | Yoneda |
| 2006/0186804 A1 | 8/2006 | Sakakura et al. |
| 2007/0178708 A1 | 8/2007 | Ukigaya |
| 2009/0017192 A1 * | 1/2009 | Matsuura ........................ 427/66 |

(Continued)

FOREIGN PATENT DOCUMENTS

| JP | 8-227276 A | 9/1996 |
| JP | 2000-188179 A | 7/2000 |

(Continued)

OTHER PUBLICATIONS

International Search Report received for PCT Patent Application No. PCT/JP2011/079059, mailed on Mar. 13, 2012, 5 pages (2 pages of English Translation and 2 pages of Official copy).

*Primary Examiner* — William D Coleman
(74) *Attorney, Agent, or Firm* — Morrison & Foerster LLP

(57) ABSTRACT

A vapor deposition source (60), a limiting plate unit (80), and a vapor deposition mask (70) are disposed in this order. The limiting plate unit includes a plurality of limiting plates (81) disposed along a first direction. At least a portion of surfaces (83) defining a limiting space (82) of the limiting plate unit and surfaces (84) of the limiting plate unit opposing the vapor deposition source is constituted by at least one outer surface member (110, 120) capable of attaching to and detaching from a base portion (85). Accordingly, a vapor deposition device that is capable of forming a coating film in which edge blur is suppressed on a large-sized substrate and that has excellent maintenance performance can be obtained.

14 Claims, 16 Drawing Sheets

(56) References Cited

U.S. PATENT DOCUMENTS

| | | | |
|---|---|---|---|
| 2010/0075506 A1* | 3/2010 | Ochi | 438/758 |
| 2010/0297348 A1 | 11/2010 | Lee et al. | |
| 2011/0306216 A1* | 12/2011 | Schuessler et al. | 438/758 |
| 2013/0059063 A1* | 3/2013 | Kawato et al. | 427/66 |
| 2013/0181209 A1* | 7/2013 | Sonoda et al. | 257/40 |
| 2013/0196454 A1* | 8/2013 | Inoue et al. | 438/5 |
| 2013/0240870 A1* | 9/2013 | Kawato et al. | 257/40 |
| 2013/0252353 A1* | 9/2013 | Kawato et al. | 438/14 |

FOREIGN PATENT DOCUMENTS

| | | |
|---|---|---|
| JP | 2004-103269 A | 4/2004 |
| JP | 2004-349101 A | 12/2004 |
| JP | 2006-261109 A | 9/2006 |
| JP | 2007-227359 A | 9/2007 |
| JP | 2010-270397 A | 12/2010 |

* cited by examiner

VAPOR DEPOSITION DEVICE, VAPOR DEPOSITION METHOD AND ORGANIC EL DISPLAY DEVICE

CROSS REFERENCE TO RELATED APPLICATIONS

This is a U.S. National Phase patent application of PCT/JP2011/079059, filed Dec. 15, 2011, which claims priority to Japanese patent application no. 2010-290149, filed Dec. 27, 2010, each of which is hereby incorporated by reference in the present disclosure in its entirety.

TECHNICAL FIELD

The present invention relates to a vapor deposition device and a vapor deposition method for forming a coating film having a predetermined pattern on a substrate. The present invention also relates to an organic EL (Electro Luminescence) display device including a light emitting layer formed by vapor deposition.

BACKGROUND ART

In recent years, flat panel displays are used in various commodity products and fields, and thus flat panel displays are required to have a large size, high image quality and low power consumption.

Under the circumstances, organic EL display devices, which include an organic EL element that utilizes electro luminescence of an organic material, are attracting great attention as all-solid state flat panel displays that are excellent as having capability of low voltage operation, quick responsivity and light emission.

Active matrix type organic EL display devices, for example, are provided with a thin film-like organic EL element on a substrate having a TFT (thin film transistor). In the organic EL element, organic EL layers including a light emitting layer are laminated between a pair of electrodes. The TFT is connected to one of the pair of electrodes. Then, voltage is applied across the pair of electrodes so as to cause the light emitting layer to emit light, whereby an image is displayed.

In a full-color organic EL display device, generally, organic EL elements including light emitting layers of respective colors of red (R), green (G) and blue (B) are formed and arranged on a substrate as sub-pixels. By causing these organic EL elements to selectively emit light at the desired brightness by using the TFT, a color image is displayed.

In order to manufacture an organic EL display device, it is necessary to form a light emitting layer made of organic light emitting materials that emit respective colors in a predetermined pattern for each organic EL element.

Known methods for forming light emitting layers in a predetermined pattern are vacuum vapor deposition method, inkjet method and laser transfer method. For example, the vacuum vapor deposition method is often used for low molecular organic EL display devices (OLEDs).

In the vacuum vapor deposition method, a mask (also called a "shadow mask") having a predetermined pattern of openings is used. The deposition surface of a substrate having the mask closely fixed thereto is disposed so as to oppose a vapor deposition source. Then, vapor deposition particles (film forming material) from the vapor deposition source are deposited onto the deposition surface through the openings of the mask, whereby a predetermined pattern of a thin film is formed. Vapor deposition is performed for each color of the light emitting layer, which is referred to as "vapor deposition by color".

For example, Patent Documents 1 and 2 disclose a method for performing vapor deposition by color in which light emitting layers for respective colors are formed by sequentially moving a mask with respect to a substrate. With such a method, a mask having a size equal to that of a substrate is used, and the mask is fixed so as to cover the deposition surface of the substrate at the time of vapor deposition.

With conventional methods for performing vapor deposition by color as described above, as the substrate becomes larger, the mask needs to be large accordingly. However, when the mask is made large, a gap is likely to appear between the substrate and the mask by the mask being bent by its own weight or being extended. In addition, the size of the gap varies depending on the position of the deposition surface of the substrate. For this reason, it is difficult to perform highly accurate patterning, and it is therefore difficult to achieve high definition due to the occurrence of positional offset between the mask and the substrate during vapor deposition and the occurrence of color mixing.

Also, when the mask is made large, the mask as well as a frame or the like for holding the mask need to be gigantic, which increases the weight and makes handling thereof difficult. As a result, there is a possibility that productivity and safety might be compromised. Also, the vapor deposition device and devices that are used together therewith need to be made gigantic and complex as well, which makes device designing difficult and increases the installation cost.

For the reasons described above, the conventional methods for vapor deposition by color that are described in Patent Documents 1 and 2 are difficult to adapt to large-sized substrates, and it is difficult to perform vapor deposition by color on large-sized substrates such as those having a size exceeding 60 inches on a mass manufacturing level.

Patent Document 3 describes a vapor deposition method for causing vapor deposition particles discharged from a vapor deposition source to adhere to a substrate after causing the vapor deposition particles to pass through a mask opening of a vapor deposition mask while relatively moving the vapor deposition source and the vapor deposition mask with respect to the substrate. With this vapor deposition method, even in the case of large-sized substrates, it is not necessary to increase the size of the vapor deposition mask in accordance with the size of the substrates.

Patent Document 4 describes that a columnar-shaped or rectangle columnar-shaped vapor deposition beam direction adjustment plate having vapor deposition beam-pass-through holes formed therein whose diameter is approximately 0.1 mm to 1 mm is disposed between a vapor deposition source and a vapor deposition mask. By causing the vapor deposition particles discharged from the vapor deposition beam emission hole of the vapor deposition source to pass through the vapor deposition beam-pass-through holes formed in the vapor deposition beam direction adjustment plate, the directivity of vapor deposition beam can be increased.

CITATION LIST

Patent Document

Patent Document 1: JP H8-227276A
Patent Document 2: JP 2000-188179A
Patent Document 3: JP 2004-349101A
Patent Document 4: JP 2004-103269A

DISCLOSURE OF INVENTION

Problem to be Solved by the Invention

According to the vapor deposition method described in Patent Document 3, a vapor deposition mask smaller than the substrate can be used, and therefore vapor deposition can be easily performed on large-sized substrates.

However, because it is necessary to relatively move the vapor deposition mask with respect to the substrate, the substrate and the vapor deposition mask need to be spaced apart from each other. With Patent Document 3, vapor deposition particles that fly from various directions may enter the mask openings of the vapor deposition mask, and therefore the width of the coating film formed on the substrate is longer than the width of the mask opening, resulting blur at the edge of the coating film.

Patent Document 4 describes that the directivity of the vapor deposition beam entering the vapor deposition mask is improved by the vapor deposition beam direction adjustment plate.

However, in the actual vapor deposition step, the vapor deposition material adheres to the inner circumferential surfaces of the vapor deposition beam-pass-through holes formed in the vapor deposition beam direction adjustment plate or the surface (undersurface) of the vapor deposition beam direction adjustment plate that opposes the vapor deposition source. If the amount of the vapor deposition material adhering to the inner circumferential surface of the vapor deposition beam-pass-through hole is increased, the effective diameter of the vapor deposition beam-pass-through hole decreases, and therefore the amount of the vapor deposition particles passing through the vapor deposition beam-pass-through hole is reduced or the function for increasing the directivity of the vapor deposition beam does not sufficiently work. Also, the vapor deposition material adhering to the inner circumferential surface of the vapor deposition beam-pass-through hole or the undersurface of the vapor deposition beam direction adjustment plate may come off and fall on the vapor deposition source, resulting in blocking the vapor deposition beam emission hole of the vapor deposition source.

In order to avoid this, it is necessary to replace the vapor deposition beam direction adjustment plate to which the vapor deposition material adheres by a new one. However, there is a problem in that the operation for replacing the vapor deposition beam direction adjustment plate is complicated and requires much labor and time, resulting a drop in the throughput at the time of mass production.

It is an object of the present invention to provide a vapor deposition device that is capable of forming a coating film in which edge blur is suppressed on a large-sized substrate and that has excellent maintenance performance.

Also, it is an object of the present invention to provide a vapor deposition method using such a vapor deposition device and achieves excellent mass productivity.

Furthermore, it is an object of the present invention to provide an inexpensive large-sized organic EL display device that has excellent reliability and display quality.

Means for Solving Problem

The vapor deposition device of the present invention is a vapor deposition device for forming a coating film having a predetermined pattern on a substrate, and the vapor deposition device includes a vapor deposition unit including a vapor deposition source having at least one vapor deposition source opening, a vapor deposition mask disposed between the at least one vapor deposition source opening and the substrate, and a limiting plate unit that is disposed between the vapor deposition source and the vapor deposition mask and that includes a plurality of limiting plates disposed along a first direction, and a moving mechanism for moving one of the substrate and the vapor deposition unit relative to the other along a second direction orthogonal to the normal line direction of the substrate and the first direction in a state in which the substrate and the vapor deposition mask are spaced apart at a fixed interval. The coating film is formed by causing vapor deposition particles that have been discharged from the at least one vapor deposition source opening and that have passed through a limiting space between the limiting plates neighboring in the first direction and a plurality of mask openings formed in the vapor deposition mask to adhere onto the substrate. The limiting plate unit has a base portion and at least one outer surface member capable of attaching to and detaching from the base portion. The at least one outer surface member constitutes at least a portion of surfaces defining the limiting space of the limiting plate unit and a surface of the limiting plate unit opposing the vapor deposition source.

The vapor deposition method of the present invention is a vapor deposition method including a vapor deposition step of forming a coating film having a predetermined pattern on a substrate by causing vapor deposition particles to adhere onto the substrate, and the vapor deposition step is performed by using the above vapor deposition device of the present invention.

An organic EL display device according to the present invention includes a light emitting layer formed by using the above vapor deposition method of the present invention.

Effects of the Invention

According to the vapor deposition device and vapor deposition method of the present invention, the vapor deposition particles that have passed through the mask openings formed in the vapor deposition mask are caused to adhere to the substrate while one of the substrate and the vapor deposition unit is moved relative to the other, and therefore a vapor deposition mask that is smaller than the substrate can be used. It is therefore possible to form a coating film even on a large-sized substrate by vapor deposition.

The plurality of limiting plates provided between the vapor deposition source opening and the vapor deposition mask selectively capture the vapor deposition particles that have entered a limiting space between limiting plates neighboring in the first direction according to the incidence angle of the vapor deposition particles, and thus only the vapor deposition particles entering at a predetermined incidence angle or less enter the mask openings. As a result, the maximum incidence angle of the vapor deposition particles with respect to the substrate becomes small, and it is therefore possible to suppress blur that occurs at the edge of the coating film formed on the substrate.

A region of the outer surface of the limiting plate unit to which a large amount of the vapor deposition material adheres is constituted by a removable outer surface member, and therefore when the vapor deposition material adheres thereto, it is sufficient that the outer surface member is only replaced instead of replacing the entire limiting plate unit. Therefore, the operation for regenerating the limiting plate unit can be easily performed in a short time. Thus, the vapor deposition device of the present invention is excellent in performance of maintenance.

The organic EL display device of the present invention includes a light emitting layer formed by using the vapor deposition method described above, and therefore the light emitting layer in which edge blur is suppressed can be formed at low cost. Accordingly, it is possible to provide an inexpensive organic EL display device that has excellent reliability and display quality and that can be made in a large size.

DESCRIPTION OF THE INVENTION

Figure 1:
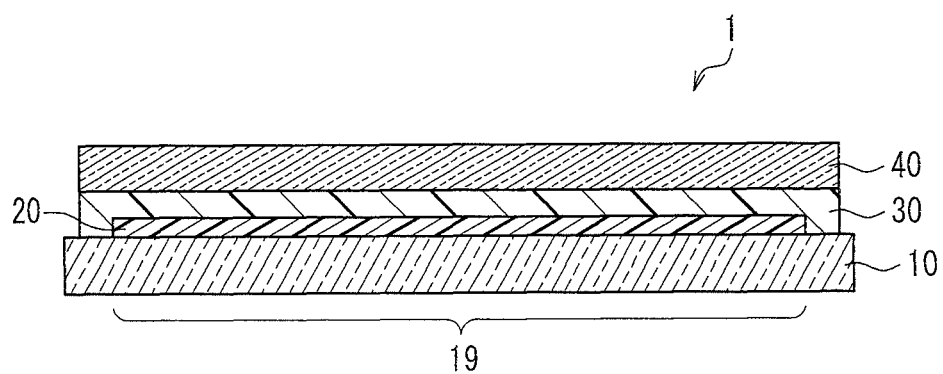
FIG. 1 is a cross-sectional view showing a schematic configuration of an organic EL display device.

The vapor deposition device of the present invention is a vapor deposition device for forming a coating film having a predetermined pattern on a substrate, and the vapor deposition device includes a vapor deposition unit including a vapor deposition source having at least one vapor deposition source opening, a vapor deposition mask disposed between the at least one vapor deposition source opening and the substrate, and a limiting plate unit that is disposed between the vapor deposition source and the vapor deposition mask and that includes a plurality of limiting plates disposed along a first direction, and a moving mechanism for moving one of the substrate and the vapor deposition unit relative to the other along a second direction orthogonal to the normal line direction of the substrate and the first direction in a state in which the substrate and the vapor deposition mask are spaced apart at a fixed interval. The coating film is formed by causing vapor deposition particles that have been discharged from the at least one vapor deposition source opening and that have passed through a limiting space between the limiting plates neighboring in the first direction and a plurality of mask openings formed in the vapor deposition mask to adhere onto the substrate. The limiting plate unit has a base portion and at least one outer surface member capable of attaching to and detaching from the base portion. The at least one outer surface member constitutes at least a portion of surfaces defining the limiting space of the limiting plate unit and a surface of the limiting plate unit opposing the vapor deposition source.

It is preferable that in the above-described vapor deposition device of the present invention, the at least one outer surface member constitutes at least a portion of side surfaces defining the limiting space of the plurality of limiting plates. The vapor deposition material is likely to adhere to the side surfaces of the limiting plates. Therefore, the side surfaces of the limiting plates can be kept in a clean state in which only a small amount of a resin material adheres thereto without reducing the productivity, by at least a portion of the side surfaces of the limiting plates being constituted by a removable outer surface member. As a result, it is possible to stably maintain the accuracy in the pattern of a coating film to be formed on the substrate by vapor deposition at a high level. Also, it is possible to prevent the inside of the vapor deposition device from being contaminated as a result of the vapor deposition material adhering to the side surfaces of the limiting plates coming off and falling.

It is preferable that the at least one outer surface member constitutes at least a portion of undersurfaces of the plurality of limiting plates opposing the vapor deposition source. The vapor deposition material is likely to adhere to the undersurfaces of the limiting plates. Therefore, the undersurfaces of the limiting plates can be kept in a clean state in which only a small amount of a resin material adheres thereto without reducing the productivity, by at least a portion of the undersurfaces of the limiting plates being constituted by a removable outer surface member. As a result, it is possible to prevent the inside of the vapor deposition device from being contaminated as a result of the vapor deposition material adhering to the undersurfaces of the limiting plates coming off and falling.

It is preferable that the at least one outer surface member includes a single first outer surface member constituting at least a portion of side surfaces defining the limiting space of the plurality of limiting plates and at least a portion of undersurfaces of the plurality of limiting plates opposing the vapor deposition source. The vapor deposition material is likely to adhere to the side surfaces and the undersurfaces of the limiting plates. Therefore, the side surfaces and the undersurfaces of the limiting plates can be kept in a clean state in which only a small amount of a resin material adheres thereto without reducing the productivity, by at least a portion of the side surfaces and the undersurfaces of the limiting plates being constituted by a removable outer surface member. As a result, it is possible to stably maintain the accuracy in the pattern of a coating film to be formed on the substrate by vapor deposition at a high level. Also, it is possible to prevent the inside of the vapor deposition device from being contaminated as a result of the vapor deposition material adhering to the side surfaces and the undersurfaces of the limiting plates coming off and falling. Furthermore, because members constituting the side surfaces and the undersurfaces of the limiting plates can be replaced at once by the side surfaces and the undersurfaces of the limiting plates being constituted by a single first outer surface member, it is possible to more easily perform the operation for regenerating the limiting plate unit in a shorter time.

It is preferable that the at least one outer surface member includes a second outer surface member constituting an edge of side surfaces defining the limiting space of the plurality of limiting plates on the side of the vapor deposition mask. The positions of the edges of the side surfaces of the limiting spaces on the side of a vapor deposition mask significantly influence the flight directions of the vapor deposition particles passing through the limiting spaces. It is possible to easily perform controls and changes of the flight directions of the vapor deposition particles by the edges of the side surfaces of the limiting spaces on the side of the vapor deposition mask being constituted by a removable second outer surface member.

It is preferable that in the above vapor deposition device, the second outer surface member protrudes toward the limiting space. Accordingly, it is possible to arbitrarily set the widths and the positions of the openings of the limiting plate unit through which the vapor deposition particles can pass using the second outer surface member.

It is preferable that the second outer surface member covers the surface of the base portion opposing the vapor deposition mask. Accordingly, it is possible to prevent a resin material from adhering to the surface of the base portion opposing the vapor deposition mask.

It is preferable that in the above-described vapor deposition device of the present invention, a plurality of through holes penetrating the base portion in the normal line direction of the substrate are disposed along the first direction in the base portion. In this case, it is preferable that the at least one outer surface member includes a first outer surface member covering inner circumferential surfaces of the plurality of through holes and the surface of the base portion opposing the vapor deposition source. Because among the outer surfaces of the base portion, the region to which the resin material is likely to adhere is covered by the removable first outer surface member, the limiting plate unit can be kept in a clean state in which only a small amount of the resin material adheres thereto without reducing the productivity. As a result, it is possible to stably maintain the accuracy in the pattern of a coating film to be formed on the substrate by vapor deposition at high level. Also, it is possible to prevent the inside of the vapor deposition device from being contaminated as a result of the vapor deposition material adhering to the limiting plate unit coming off and falling. Furthermore, because the limiting plate unit can be regenerated by only replacing the first outer surface member, it is possible to easily perform the operation for regenerating the limiting plate unit in a short time.

It is preferable that in the above-described vapor deposition device, the base portion is dividable along a division plane passing across the plurality of through holes and parallel to the first direction. Accordingly, it is possible to easily perform the operation for replacing the first outer surface member in a short time.

It is preferable that the first outer surface member is capable of attaching to and detaching from the base portion without moving in the normal line direction of the substrate. Accordingly, it is possible to easily perform the operation for replacing the first outer surface member in a short time.

It is preferable that the at least one outer surface member has a multilayer structure, and each layer constituting the multilayer structure is removable in order. Accordingly, it is possible to more easily perform the operation for regenerating the limiting plate unit in a shorter time.

It is preferable that the base portion is a cooling block for cooling the limiting plate unit. Accordingly, it is possible to prevent characteristics of capturing the vapor deposition particles colliding with the limiting plate unit from decreasing, and also to prevent the vapor deposition particles adhering to the limiting plate unit from re-vaporizing.

Hereinafter, the present invention will be described in detail by showing preferred embodiments. It should be noted, however, that the present invention is not limited to the following embodiments. For the sake of convenience of the description, the drawings referred to hereinafter show only the principal members required to describe the present invention in simplified form among the constituent members of the embodiments of the present invention. Accordingly, the present invention may include optional constituent members that are not shown in the following drawings. Also, the dimensions of the members in the drawings do not faithfully represent the actual dimensions or dimensional proportions of the constituent members.

(Configuration of Organic EL Display Device)

An example of an organic EL display device that can be manufactured by applying the present invention will be described. This organic EL display device is a bottom emission type organic EL display device in which light is extracted from the TFT substrate side and that displays full color images by controlling light emission of red (R), green (G) and blue (B) pixels (sub-pixels).

First, the overall configuration of the organic EL display device will be described below.

Figure 2:
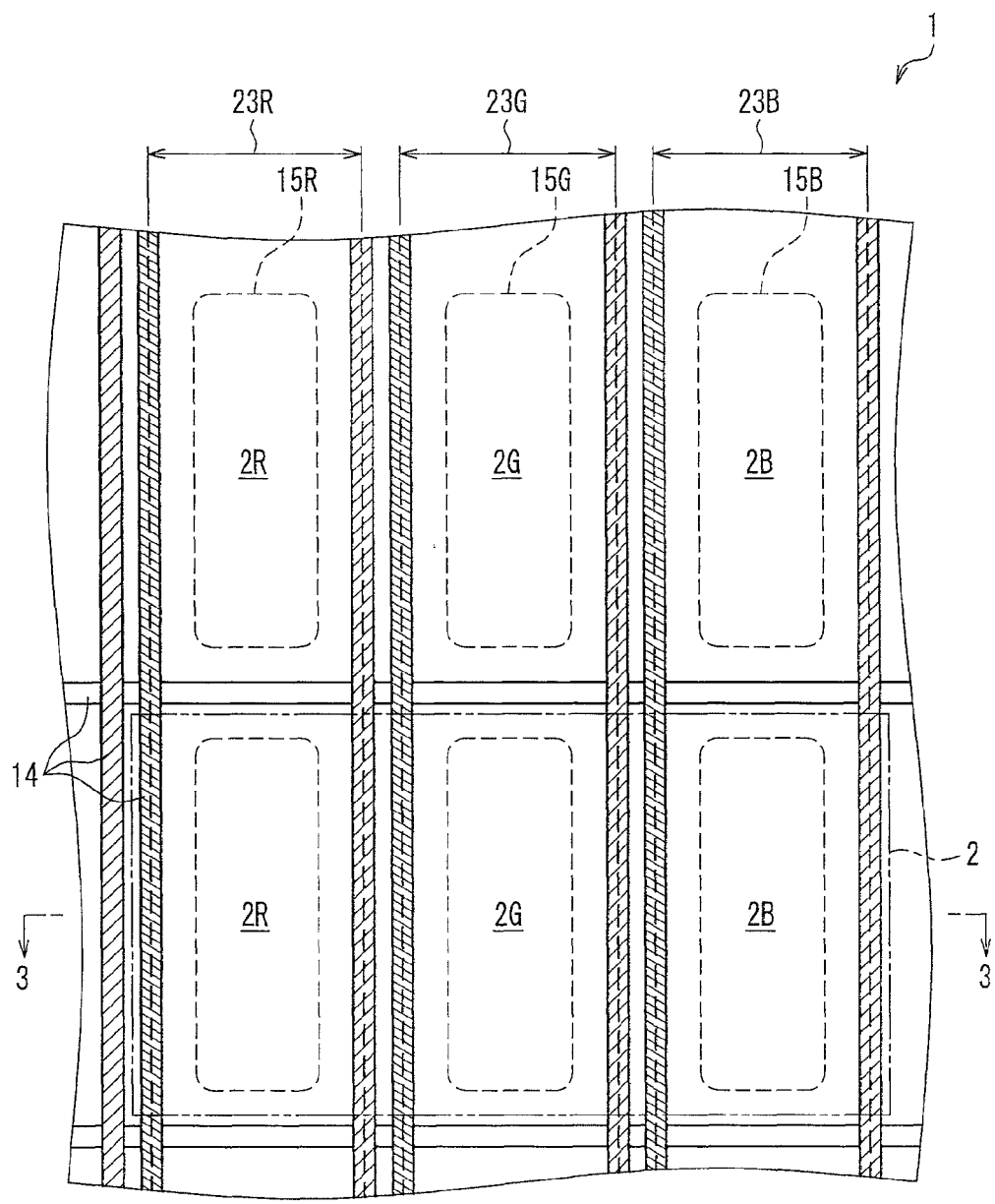
FIG. 2 is a plan view showing a configuration of pixels that constitute the organic EL display device shown in FIG. 1.
Figure 3:
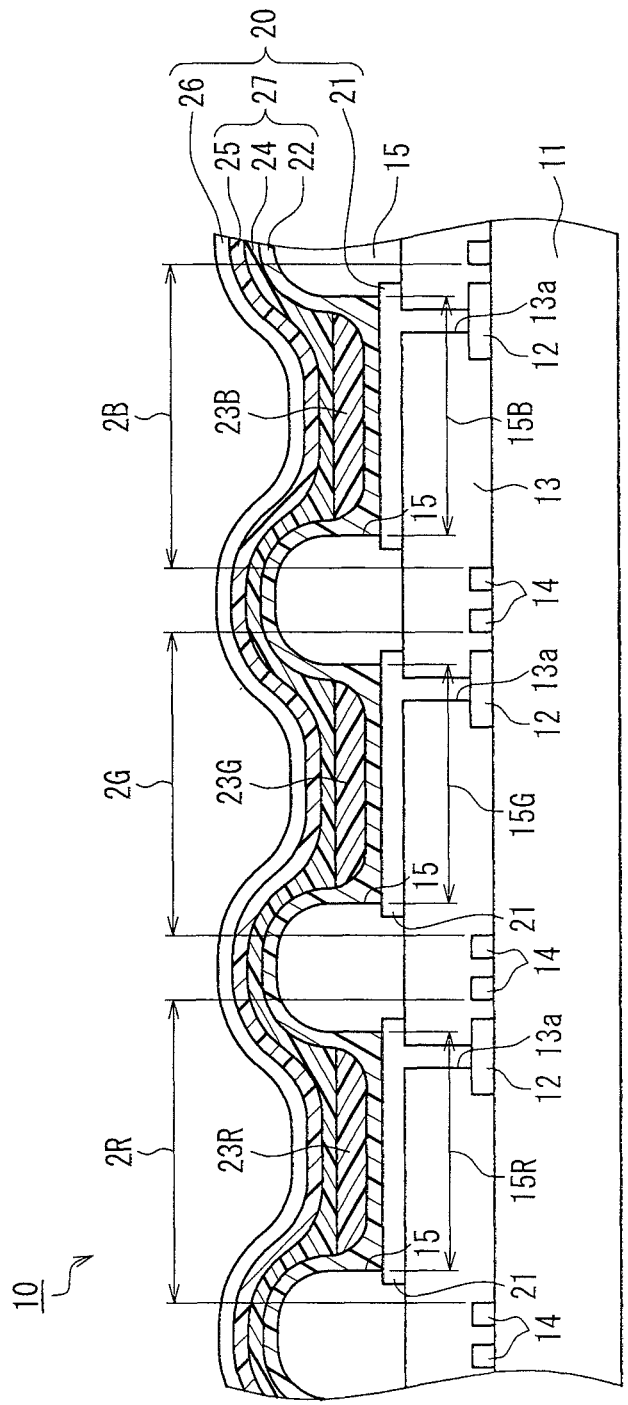
FIG. 3 is a cross-sectional view of a TFT substrate that constitutes the organic EL display device taken along the line 3-3 of FIG. 2.

FIG. 1 is a cross-sectional view showing a schematic configuration of the organic EL display device. FIG. 2 is a plan view showing a configuration of pixels that constitute the organic EL display device shown in FIG. 1. FIG. 3 is a cross-sectional view of a TFT substrate that constitutes the organic EL display device, taken along the line III-III of FIG. 2.

As shown in FIG. 1, the organic EL display device 1 has a configuration in which, on a TFT substrate 10 provided with a TFT 12 (see FIG. 3), an organic EL element 20 connected to the TFT 12, an adhesive layer 30 and a sealing substrate 40 are provided in this order. A display region 19 in which images are displayed is located in the center of the organic EL display device 1, and the organic EL element 20 is disposed within the display region 19.

The organic EL element 20 is enclosed between a pair of substrates, namely, the TFT substrate 10 and the sealing substrate 40, by the TFT substrate 10 having the organic EL element 20 laminated thereon being bonded to the sealing substrate 40 with the use of the adhesive layer 30. By the organic EL element 20 being enclosed between the TFT substrate 10 and the sealing substrate 40 as described above, oxygen and moisture are prevented from entering the organic EL element 20 from the outside.

As shown in FIG. 3, the TFT substrate 10 includes, as a support substrate, a transparent insulating substrate 11 such as a glass substrate, for example. In the case of a top emission type organic EL display device, however, the insulating substrate 11 is not necessarily transparent.

As shown in FIG. 2, on the insulating substrate 11, a plurality of wires 14 are provided that include a plurality of gate lines provided in the horizontal direction and a plurality of signal lines intersecting the gate lines and provided in the vertical direction. A gate line driving circuit (not shown) that drives the gate lines is connected to the gate lines, and a signal line driving circuit (not shown) that drives the signal lines are connected to the signal lines. On the insulating substrate 11, red (R), green (G) and blue (B) sub-pixels 2R, 2G and 2B made of the organic EL element 20 are disposed in a matrix in their respective regions surrounded by the wires 14.

The sub-pixels 2R emit red light, the sub-pixels 2G emit green light, and the sub-pixels 2B emit blue light. Sub-pixels of the same color are disposed in a column direction (up-down direction in FIG. 2) and a repeating unit consisting of sub-pixels 2R, 2G and 2B is repeatedly disposed in a row direction (right-left direction in FIG. 2). The sub-pixels 2R, 2G and 2B constituting a repeating unit in the row direction constitute a pixel 2 (specifically, a single pixel).

The sub-pixels 2R, 2G and 2B respectively include light emitting layers 23R, 23G and 23B that emit respective colors. The light emitting layers 23R, 23G and 23B are provided to extend in stripes in the column direction (up-down direction in FIG. 2).

A configuration of the TFT substrate 10 will be described.

As shown in FIG. 3, the TFT substrate 10 includes, on the transparent insulating substrate 11 such as a glass substrate, the TFT 12 (switching element), the wires 14, an inter-layer film 13 (inter-layer insulating film, planarized film), an edge cover 15, and so on.

The TFT 12 functions as a switching element that controls light emission of the sub-pixels 2R, 2G and 2B, and is provided for each of the sub-pixels 2R, 2G and 2B. The TFT 12 is connected to the wires 14.

The inter-layer film 13 also functions as a planarized film, and is laminated over the display region 19 of the insulating substrate 11 so as to cover the TFT 12 and the wires 14.

A first electrode 21 is formed on the inter-layer film 13. The first electrode 21 is electrically connected to the TFT 12 via a contact hole 13a formed in the inter-layer film 13.

The edge cover 15 is formed on the inter-layer film 13 so as to cover pattern ends of the first electrode 21. The edge cover 15 is an insulating layer for preventing short-circuiting between the first electrode 21 and a second electrode 26 that constitute the organic EL element 20 caused by an organic EL layer 27 becoming thin or the occurrence of electric field concentration at the pattern ends of the first electrode 21.

The edge cover 15 has openings 15R, 15G and 15B for the sub-pixels 2R, 2G and 2B. The openings 15R, 15G and 15B of the edge cover 15 serve as light emitting regions of the sub-pixels 2R, 2G and 2B. To rephrase, the sub-pixels 2R, 2G and 2B are partitioned by the edge cover 15 that is insulative. The edge cover 15 also functions as an element separation film.

The organic EL element 20 will be described.

The organic EL element 20 is a light emitting element capable of emitting highly bright light by low voltage direct current driving, and includes the first electrode 21, the organic EL layer 27 and the second electrode 26 in this order.

The first electrode 21 is a layer having a function of injecting (supplying) holes into the organic EL layer 27. As described above, the first electrode 21 is connected to the TFT 12 via the contact hole 13a.

As shown in FIG. 3, the organic EL layer 27 includes, between the first electrode 21 and the second electrode 26, a hole injection and transport layer 22, the light emitting layers 23R, 23G, 23B, an electron transport layer 24 and an electron injection layer 25 in this order from the first electrode 21 side.

In the present embodiment, the first electrode 21 serves as a positive electrode and the second electrode 26 serves as a negative electrode, but the first electrode 21 may serve as a negative electrode and the second electrode 26 may serve as a positive electrode. In this case, the order of the layers constituting the organic EL layer 27 is reversed.

The hole injection and transport layer 22 functions both as a hole injection layer and a hole transport layer. The hole injection layer is a layer having a function of enhancing the efficiency of injecting holes into the organic EL layer 27. The hole transport layer is a layer having a function of enhancing the efficiency of transporting holes to the light emitting layers 23R, 23G and 23B. The hole injection and transport layer 22 is formed uniformly over the display region 19 in the TFT substrate 10 so as to cover the first electrode 21 and the edge cover 15.

In the present embodiment, the hole injection and transport layer 22 in which a hole injection layer and a hole transport layer are integrated together is provided, but the present invention is not limited thereto, and the hole injection layer and the hole transport layer may be formed as independent layers.

On the hole injection and transport layer 22, the light emitting layers 23R, 23G and 23B are formed correspondingly to the columns of the sub-pixels 2R, 2G and 2B so as to cover the openings 15R, 15G and 15B of the edge cover 15, respectively. The light emitting layers 23R, 23G and 23B are layers having a function of emitting light by recombining holes injected from the first electrode 21 side and electrons injected from the second electrode 26 side. The light emitting layers 23R, 23G and 23B each contain a material having a high light-emission efficiency such as a low-molecular fluorescent dye or a metal complex.

The electron transport layer 24 is a layer having a function of enhancing the efficiency of transporting electrons from the second electrode 26 to the light emitting layers 23R, 23G and 23B.

The electron injection layer 25 is a layer having a function of enhancing the efficiency of injecting electrons from the second electrode 26 to the organic EL layer.

The electron transport layer 24 is formed uniformly over the display region 19 in the TFT substrate 10 such that it is on the light emitting layers 23R, 23G and 23B and the hole injection and transport layer 22 so as to cover the light emitting layers 23R, 23G and 23B and the hole injection and transport layer 22. Likewise, the electron injection layer 25 is formed uniformly over the display region 19 in the TFT substrate 10 such that it is on the electron transport layer 24 so as to cover the electron transport layer 24.

In the present embodiment, the electron transport layer 24 and the electron injection layer 25 are provided as independent layers, but the present invention is not limited thereto, and they may be provided as a single layer (specifically, an electron transport and injection layer) in which the electron transport layer 24 and the electron injection layer 25 are integrated together.

The second electrode 26 is a layer having a function of injecting electrons into the organic EL layer 27. The second electrode 26 is formed uniformly over the display region 19 in the TFT substrate 10 such that it is on the electron injection layer 25 so as to cover the electron injection layer 25.

An organic layer other than the light emitting layers 23R, 23G and 23B is not essential to the organic EL layer 27, and may be selected or omitted according to the characteristics required of the organic EL element 20. The organic EL layer 27 may further include a carrier blocking layer if necessary. By adding a hole blocking layer serving as a carrier blocking layer between the electron transport layer 24 and the light emitting layer 23R, 23G, 23B, for example, it is possible to prevent holes from escaping to the electron transport layer 24, whereby light-emission efficiency can be improved.

(Manufacturing Method for Organic EL Display Device)

A method for manufacturing an organic EL display device 1 will be described below.

Figure 4:
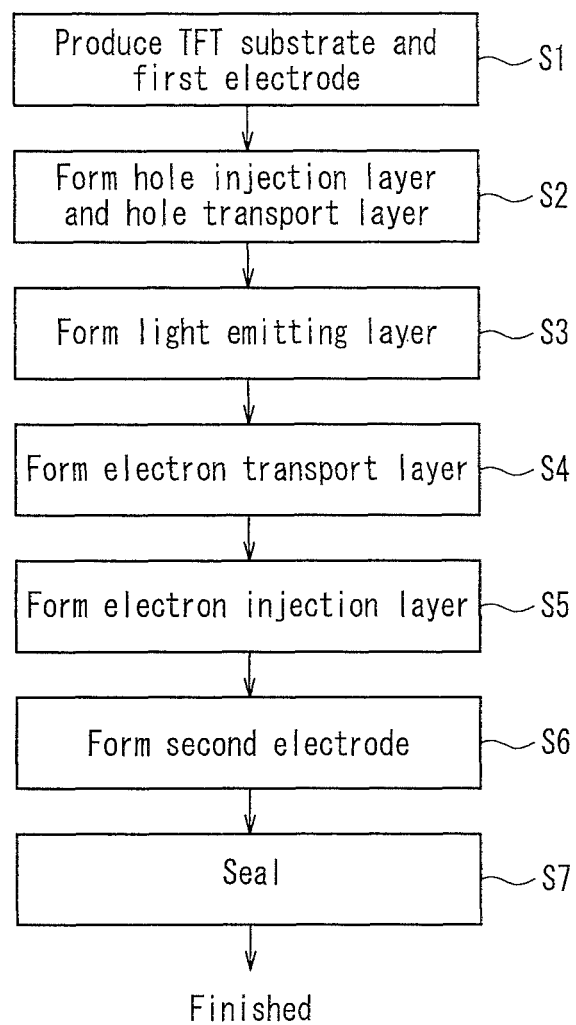
FIG. 4 is a flowchart illustrating the steps of a process for manufacturing an organic EL display device in order.

FIG. 4 is a flowchart illustrating the steps of a process for manufacturing the above-described organic EL display device 1 in order.

As shown in FIG. 4, the method for manufacturing an organic EL display device 1 according to the present embodiment includes, for example, a TFT substrate/first electrode producing step S1, a hole injection layer/hole transport layer forming step S2, a light emitting layer forming step S3, an electron transport layer forming step S4, an electron injection layer forming step S5, a second electrode forming step S6 and a sealing step S7 in this order.

Each step of FIG. 4 will be described below. It should be noted, however, that the dimensions, materials and shapes of the constituent elements described below are merely examples, and the present invention is not limited thereto. Also, in the present embodiment, the first electrode 21 is used as a positive electrode and the second electrode 26 is used as a negative electrode, but in the case where the first electrode 21 is used as a negative electrode and the second electrode 26 is used as a positive electrode, the order of the layers laminated in the organic EL layer is reversed from that discussed below. Likewise, the materials for constituting the first electrode 21 and the second electrode 26 are also reversed from those discussed below.

First, a TFT 12, wires 14 and the like are formed on an insulating substrate 11 by a known method. As the insulating substrate 11, for example, a transparent glass substrate, plastic substrate or the like can be used. As an example, a rectangular glass plate having a thickness of about 1 mm and longitudinal and transverse dimensions of 500×400 mm can be used as the insulating substrate 11.

Next, a photosensitive resin is applied onto the insulating substrate 11 so as to cover the TFT 12 and the wires 14, and patterning is performed using a photolithography technique to form an inter-layer film 13. As a material for the inter-layer film 13, for example, an insulating material such as acrylic resin or polyimide resin can be used. Generally, polyimide resin is not transparent but colored. For this reason, when manufacturing a bottom emission type organic EL display device 1 as shown FIG. 3, it is preferable to use a transparent resin such as acrylic resin for the inter-layer film 13. There is no particular limitation on the thickness of the inter-layer film 13 as long as irregularities in the upper surface of the TFT 12 can be eliminated. As an example, an inter-layer film 13 having a thickness of about 2 μm can be formed by using acrylic resin.

Next, contact holes 13a for electrically connecting the first electrode 21 to the inter-layer film 13 are formed.

Next, a first electrode 21 is formed on the inter-layer film 13. Specifically, a conductive film (electrode film) is formed on the inter-layer film 13. Next, a photoresist is applied onto the conductive film and patterning is performed by using a photolithography technique, after which the conductive film is etched using ferric chloride as an etching solution. After that, the photoresist is stripped off using a resist stripping solution, and the substrate is washed. A first electrode 21 in a matrix is thereby obtained on the inter-layer film 13.

Examples of conductive film-forming materials that can be used for the first electrode 21 include transparent conductive materials such as ITO (indium tin oxide), IZO (indium zinc oxide) and gallium-added zinc oxide (GZO); and metal materials such as gold (Au), nickel (Ni) and platinum (Pt).

As the method for laminating conductive films, it is possible to use a sputtering method, a vacuum vapor deposition method, a CVD (chemical vapor deposition) method, a plasma CVD method, a printing method or the like can be used.

As an example, a first electrode 21 having a thickness of about 100 nm can be formed by a sputtering method using ITO.

Next, an edge cover 15 having a predetermined pattern is formed. The edge cover 15 can be formed by, for example, patterning performed in the same manner as performed for the inter-layer film 13, using the same insulating materials as those listed for the edge cover 15. As an example, an edge cover 15 having a thickness of about 1 μm can be formed using acrylic resin.

Through the above processing, the TFT substrate 10 and the first electrode 21 are produced (Step S1).

Next, the TFT substrate 10 that has undergone step S1 is baked under reduced pressure for the purpose of dehydration and then subjected to an oxygen plasma treatment in order to wash the surface of the first electrode 21.

Next, on the TFT substrate 10, a hole injection layer and a hole transport layer (in the present embodiment, a hole injection and transport layer 22) is formed over the display region 19 in the TFT substrate 10 by a vapor deposition method (S2).

Specifically, an open mask having an opening corresponding to the entire display region 19 is closely fixed to the TFT substrate 10. Materials for forming a hole injection layer and a hole transport layer are deposited over the display region 19 in the TFT substrate 10 through the opening of the open mask while the TFT substrate 10 and the open mask are rotated together.

As noted above, the hole injection layer and the hole transport layer may be integrated into a single layer, or may be independent layers. Each layer has a thickness of, for example, 10 to 100 nm.

Examples of materials for the hole injection layer and the hole transport layer include benzine, styryl amine, triphenyl amine, porphyrin, triazole, imidazole, oxadiazole, polyarylalkane, phenylene diamine, arylamine, oxazole, anthracene, fluorenone, hydrazone, stilbene, triphenylene, azatriphenylene and derivatives thereof, heterocyclic or linear conjugated monomers, oligomers or polymers, such as polysilane-based compounds, vinylcarbazole-based compounds, thiophene-based compounds, aniline-based compounds and the like.

As an example, a hole injection and transport layer 22 having a thickness of 30 nm can be formed using 4,4'-bis[N-(1-naphthyl)-N-phenylamino]biphenyl (α-NPD).

Next, on the hole injection and transport layer 22, light emitting layers 23R, 23G and 23B are formed in stripes so as to cover openings 15R, 15G and 15B in the edge cover 15 (S3). The light emitting layers 23R, 23G and 23B are deposited such that respective colors, namely, red, green and blue are applied to corresponding predetermined regions (vapor deposition by color).

As materials for the light emitting layers 23R, 23G and 23B, materials having a high light-emission efficiency such as low-molecular fluorescent dyes or metal complexes can be used. Examples thereof include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene and derivatives thereof, tris(8-quinolinolato)aluminum complex, bis(benzoquinolinato) beryllium complex, tri(dibenzoylmethyl)phenanthroline europium complex, ditolyl vinyl biphenyl and the like.

The light emitting layers 23R, 23G and 23B can have a thickness of, for example, 10 to 100 nm.

The vapor deposition method and the deposition device of the present invention can be used particularly suitably in vapor deposition by color for forming light emitting layers 23R, 23G and 23B. The method for forming light emitting layers 23R, 23G and 23B using the present invention will be described later in detail.

Next, an electron transport layer 24 is formed over the display region 19 in the TFT substrate 10 so as to cover the hole injection and transport layer 22 and the light emitting layers 23R, 23G and 23B by a vapor deposition method (S4). The electron transport layer 24 can be formed in the same manner as in the hole injection layer/hole transport layer forming step (S2) described above.

Next, an electron injection layer 25 is formed over the display region 19 in the TFT substrate 10 so as to cover the electron transport layer 24 by a vapor deposition method (S5). The electron injection layer 25 can be formed in the same manner as in the hole injection layer/hole transport layer forming step (S2) described above.

Examples of materials for the electron transport layer 24 and the electron injection layer 25 include quinoline, perylene, phenanthroline, bisstyryl, pyrazine, triazole, oxazole, oxadiazole, fluorenone, and derivatives and metal complexes thereof, LiF (lithium fluoride) and the like.

As noted above, the electron transport layer 24 and the electron injection layer 25 may be formed as a single layer in which these layers are integrated together, or may be formed as independent layers. Each layer has a thickness of, for example, 1 to 100 nm. The total thickness of the electron transport layer 24 and the electron injection layer 25 is, for example, 20 to 200 nm.

As an example, an electron transport layer 24 having a thickness of 30 nm can be formed using Alq (tris(8-hydroxyquinoline)aluminum), and an electron injection layer 25 having a thickness of 1 nm can be formed using LiF (lithium fluoride).

Next, a second electrode 26 is formed over the display region 19 in the TFT substrate 10 so as to cover the electron injection layer 25 by a vapor deposition method (S6). The second electrode 26 can be formed in the same manner as in the hole injection layer/hole transport layer forming step (S2) described above. The material (electrode material) for the second electrode 26 is preferably a metal having a small work function, or the like. Examples of such electrode materials include magnesium alloy (MgAg and the like), aluminum alloy (AlLi, AlCa, AlMg and the like), metal calcium, and the like. The second electrode 26 has a thickness of, for example, 50 to 100 nm. As an example, a second electrode 26 having a thickness of 50 nm can be formed using aluminum.

On the second electrode 26, a protective film may be formed so as to cover the second electrode 26, in order to prevent oxygen and moisture from entering the organic EL element 20 from the outside. As the material for the protective film, an insulating or conductive material can be used. Examples thereof include silicon nitride and silicon oxide. The protective film has a thickness of, for example, 100 to 1000 nm.

Through the above processing, the organic EL element 20 including the first electrode 21, the organic EL layer 27 and the second electrode 26 can be formed on the TFT substrate 10.

Next, as shown in FIG. 1, the TFT substrate 10 having the organic EL element 20 formed thereon is bonded to a sealing substrate 40 by using an adhesive layer 30 so as to enclose the organic EL element 20. As the sealing substrate 40, for example, an insulating substrate, such as a glass substrate or a plastic substrate, having a thickness of 0.4 to 1.1 mm can be used.

In this manner, an organic EL display device 1 is obtained.

In the organic EL display device 1, when the TFT 12 is turned on by input of signals from the wires 14, holes are injected from the first electrode 21 into the organic EL layer 27. On the other hand, electrons are injected from the second electrode 26 into the organic EL layer 27. The holes and the electrons are recombined in the light emitting layers 23R, 23G and 23B and emit predetermined color light when deactivating energy. By controlling emitting brightness of each of the sub-pixels 2R, 2G and 2B, a predetermined image can be displayed on the display region 19.

Hereinafter, S3, which is the step of forming light emitting layers 23R, 23G and 23B by vapor deposition by color, will be described.

(New Vapor Deposition Method)

The present inventors investigated, as the method for forming light emitting layers 23R, 23G and 23B by vapor deposition by color, a new vapor deposition method (hereinafter referred to as the "new vapor deposition method") in which vapor deposition is performed while a substrate is moved with respect to a vapor deposition source and a vapor deposition mask, instead of the vapor deposition method as disclosed in Patent Documents 1 and 2 in which a mask having the same size as a substrate is fixed to the substrate at the time of vapor deposition.

Figure 5:
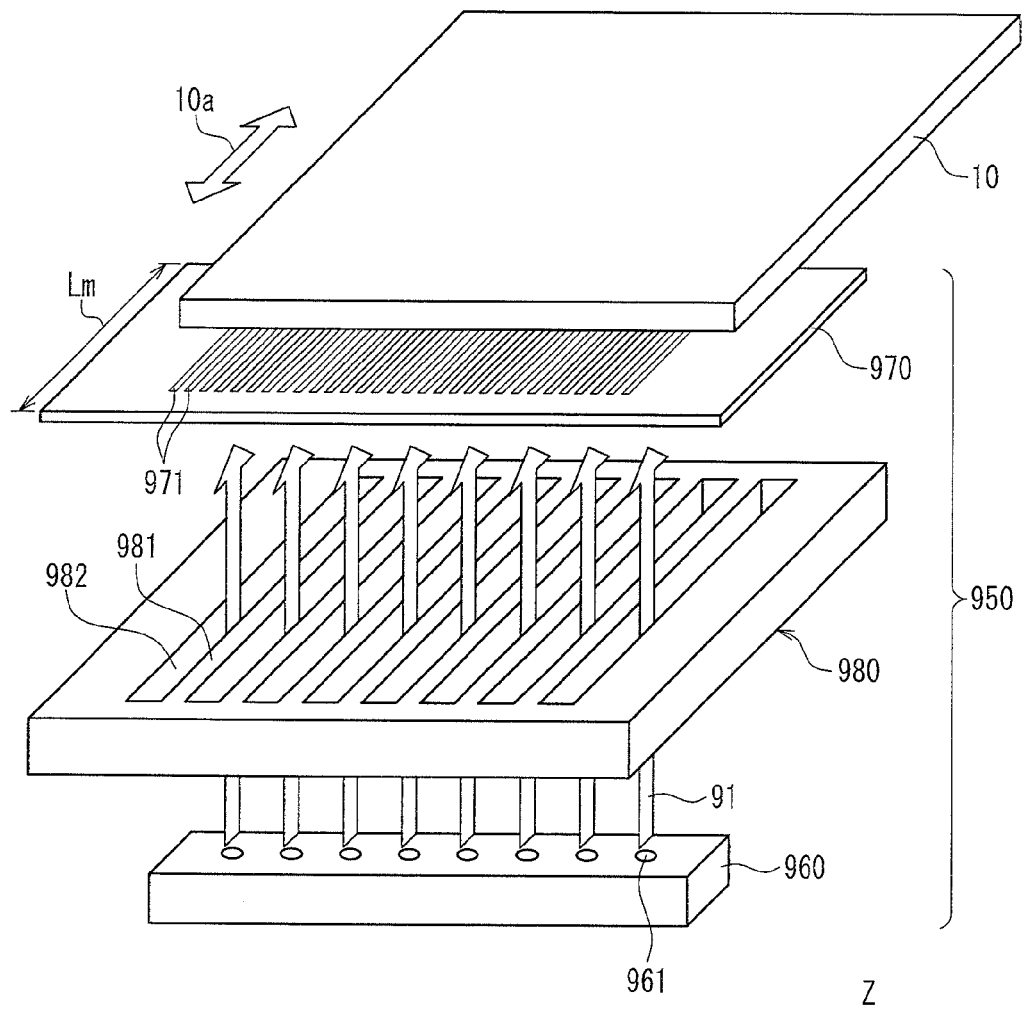
FIG. 5 is a perspective view showing the basic configuration of a vapor deposition device according to a new vapor deposition method.
Figure 6:
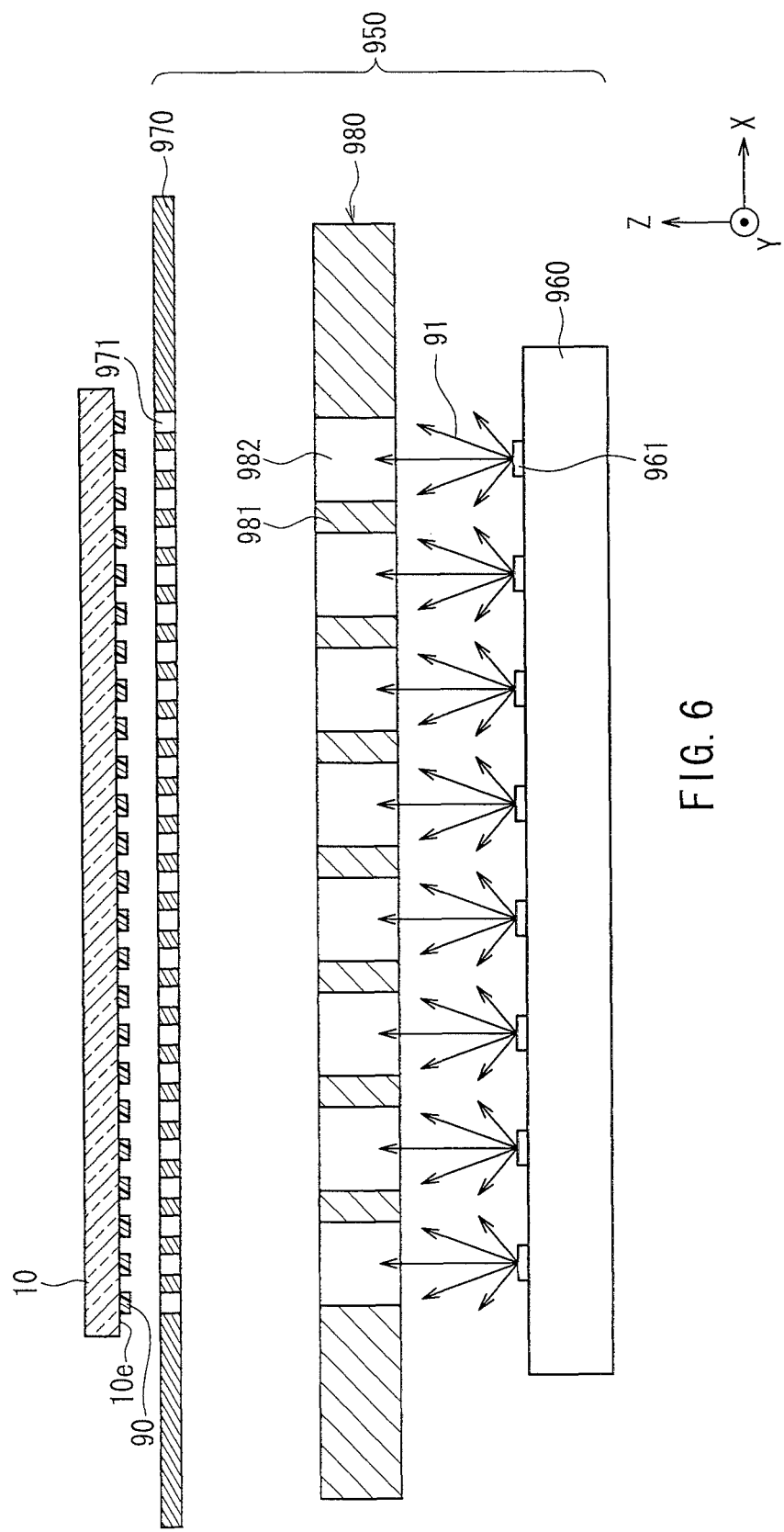
FIG. 6 is a front cross-sectional view of the vapor deposition device shown in FIG. 5 as viewed in a direction parallel to the traveling direction of a substrate.

FIG. 5 is a perspective view showing the basic configuration of the vapor deposition device according to the new vapor deposition method. FIG. 6 is a front cross-sectional view of the vapor deposition device shown in FIG. 5.

A vapor deposition source 960, a vapor deposition mask 970, and a limiting plate unit 980 disposed therebetween constitute a vapor deposition unit 950. The relative positions of the vapor deposition source 960, the limiting plate unit 980, and the vapor deposition mask 970 are constant. The substrate 10 moves along an arrow 10a at a constant speed with respect to the vapor deposition mask 970 on the opposite side from the vapor deposition source 960. For the sake of convenience of the description given below, an XYZ orthogonal coordinate system is set in which a horizontal axis parallel to the movement direction 10a of the substrate 10 is defined as the Y axis, a horizontal axis perpendicular to the Y axis is defined as the X axis, and a vertical axis perpendicular to the X axis and the Y axis is defined as the Z axis. The Z axis is parallel to the normal line direction of the deposition surface 10e of the substrate 10.

A plurality of vapor deposition source openings 961 that discharge vapor deposition particles 91 are formed on the upper surface of the vapor deposition source 960. The plurality of vapor deposition source openings 961 are arranged at a fixed pitch along a straight line parallel to the X axis.

The limiting plate unit 980 has a plurality of limiting plates 981. The major surface (the surface having the largest area) of each of the limiting plates 981 is parallel to the YZ plane. The plurality of limiting plates 981 are arranged parallel to the direction in which the plurality of vapor deposition source openings 961 are arranged (that is, the X axis direction), at a fixed pitch. A space between limiting plates 981 neighboring in the X axis direction that penetrates the limiting plate unit 980 in the Z axis direction is referred to as a limiting space 982.

A plurality of mask openings 971 are formed in the vapor deposition mask 970. The plurality of mask openings 971 are arranged along the X axis direction.

The vapor deposition particles 91 discharged from the vapor deposition source openings 961 pass through the limiting spaces 982, further pass through the mask openings 971, and adhere to the substrate 10 to form a stripe-shaped coating film 90 parallel to the Y axis. Vapor deposition is repeatedly performed for each color of light emitting layers 23R, 23G and 23B, whereby vapor deposition by color for forming light emitting layers 23R, 23G and 23B can be performed.

According to this new vapor deposition method, a dimension Lm of the vapor deposition mask 970 in the movement direction 10*a* of the substrate 10 can be set irrespective of a dimension of the substrate 10 in the same direction. This enables the use of a vapor deposition mask 970 that is smaller than the substrate 10. Accordingly, even if the substrate 10 is made large, the vapor deposition mask 970 does not need to be made large, and therefore the problem in that the vapor deposition mask 970 is bent by its own weight or being extended does not occur. Also, the vapor deposition mask 970 and a frame or the like for holding the vapor deposition mask 970 do not need to be made big and heavy. Accordingly, the problems encountered with the conventional vapor deposition methods disclosed in Patent Documents 1 and 2 are solved, and large-sized substrates can be subjected to vapor deposition by color.

Effects of the new vapor deposition method on the limiting plate unit 980 are now described.

Figure 7:
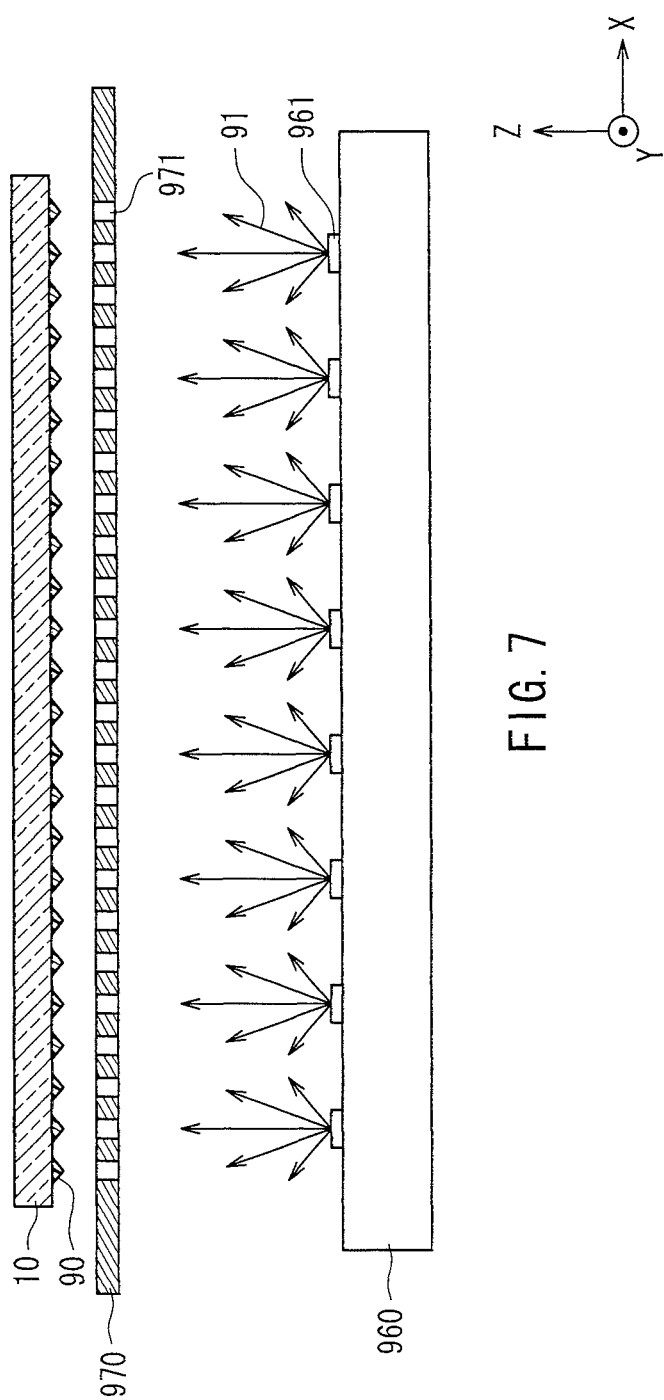
FIG. 7 is a front cross-sectional view of the vapor deposition device shown in FIG. 5 without a limiting plate unit.

FIG. 7 is a cross-sectional view showing the vapor deposition device according to the new vapor deposition method similar to FIG. 6 except that the limiting plate unit 980 is omitted.

As shown in FIG. 7, the vapor deposition particles 91 from each vapor deposition source opening 961 are discharged with a certain spread (directivity). Specifically, in FIG. 7, the number of vapor deposition particles 91 discharged from each vapor deposition source opening 961 is the greatest in a direction upward from the vapor deposition source opening 961 (the Z axis direction) and gradually decreases as the angle (departure angle) formed with respect to the straight upward direction increases. The vapor deposition particles 91 discharged from the vapor deposition source openings 961 travel straight in their discharged directions. In FIG. 7, the flow of vapor deposition particles 91 discharged from the vapor deposition source openings 961 is conceptually indicated by arrows. The length of the arrows corresponds to the number of vapor deposition particles. Accordingly, each mask opening 971 mostly receives, but not necessarily limited thereto, the vapor deposition particles 91 discharged from the vapor deposition source opening 961 located directly below the mask opening 971 and also receives the vapor deposition particles 91 discharged from the vapor deposition source openings 961 located obliquely downward.

Figure 8:
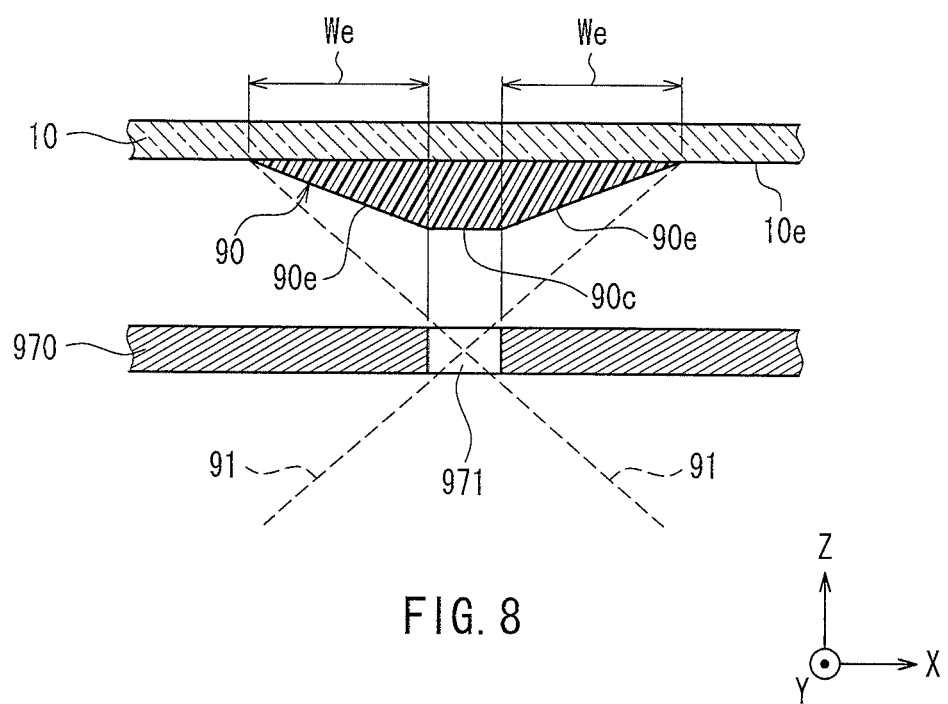
FIG. 8 is a cross-sectional view illustrating the cause of blur generated at both edges of a coating film.

FIG. 8 is a cross-sectional view of a coating film 90 formed on a substrate 10 with vapor deposition particles 91 that have passed through a mask opening 971 in the vapor deposition device of FIG. 7, as viewed in a plane perpendicular to the Y axis as in FIG. 7. As described above, the vapor deposition particles 91 coming from various directions pass through the mask opening 971. The number of vapor deposition particles 91 that reach a deposition surface 10*e* of the substrate 10 is the greatest in a region directly above the mask opening 971 and gradually decreases as the position gets farther away therefrom. Accordingly, as shown in FIG. 8, on the deposition surface 10*e* of the substrate 10, a coating film main portion 90*c* having a large and substantially constant thickness is formed in the region where the mask opening 971 is projected onto the substrate 10 from directly above, and blur portions 90*e* that are gradually thinner as the position gets farther away from the coating film main portion 90*c* are formed on both sides of the coating film main portion 90*c*. Then, the blur portions 90*e* cause blur at the edge of the coating film 90.

In order to reduce the width We of the blur portion 90*e*, a space between the vapor deposition mask 970 and the substrate 10 needs only be reduced. However, because it is necessary to move the substrate 10 relative to the vapor deposition mask 970, it is not possible to reduce the space between the vapor deposition mask 970 and the substrate 10 to zero.

If the blur portion 90*e* extends to the neighboring light emitting layer region having a different color due to an increase in the width We of the blur portion 90*e*, it causes "color mixing" or degradation of the characteristics of the organic EL element. In order to prevent the blur portion 90*e* from extending to the neighboring light emitting layer region having a different color, so as to not cause color mixing, it is necessary to reduce the opening width of pixels (the pixels referring to the sub-pixels 2R, 2G and 2B shown in FIG. 2) or to increase the pixel pitch so as to increase the non-light-emitting region. However, if the opening width of the pixels is reduced, the light-emitting region will be small, causing a reduction in brightness. If the current density is increased in order to obtain the required brightness, the organic EL element will have a short service life and easily be damaged, causing a reduction in reliability. If, on the other hand, the pixel pitch is increased, display of high definition images cannot be achieved, reducing the quality of display.

In contrast, with a new vapor deposition method, as shown in FIG. 6, the limiting plate unit 980 is provided between the vapor deposition source 960 and the vapor deposition mask 970.

Figure 9A:
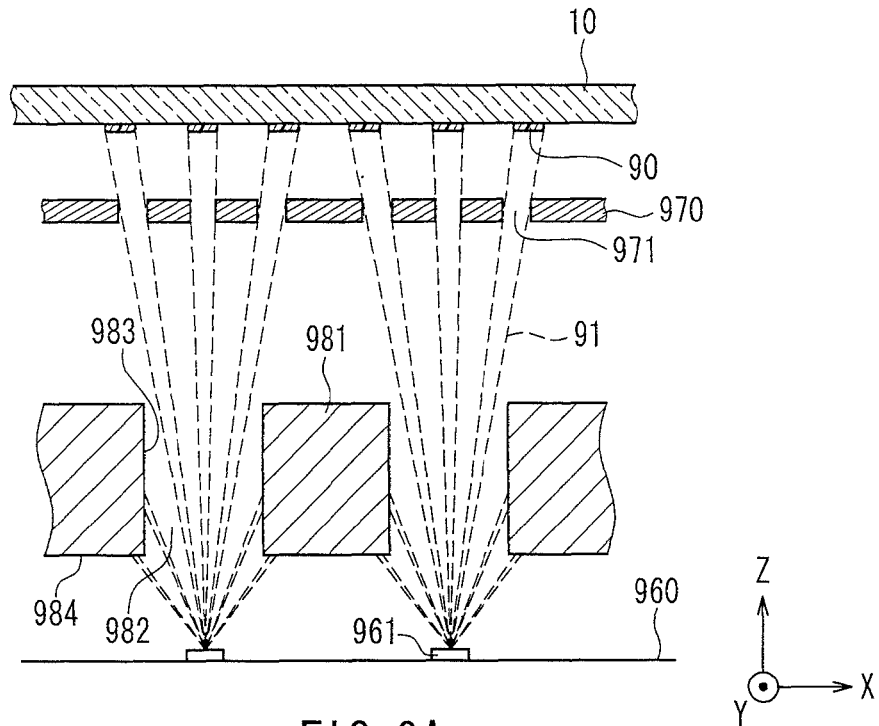
FIG. 9A is an enlarged cross-sectional view showing how a coating film is formed on a substrate in the new vapor deposition method.

FIG. 9A is an enlarged cross-sectional view showing how the coating film 90 is formed on the substrate 10 in the new vapor deposition method. In the present example, one vapor deposition source opening 961 is disposed for one limiting space 982, and the vapor deposition source opening 961 is disposed at the central position of a pair of the limiting plates 981 in the X axis direction. The representative flight pathways of the vapor deposition particles 91 discharged from the vapor deposition source openings 961 are indicated by dashed lines. Among the vapor deposition particles 91 discharged from the vapor deposition source opening 961 with a certain spread (directivity), those passing through the limiting space 982 directly above the vapor deposition source opening 961 and then passing through the mask opening 971 adhere to the substrate 10 so as to form the coating film 90. On the other hand, the vapor deposition particles 91 having a large speed vector component in the X axis direction collide with and adhere to side surfaces 983 of the limiting plates 981 that define the limiting space 982, and therefore cannot pass through limiting spaces 982 and cannot reach the mask openings 971. That is, the limiting plates 981 limit the incidence angle of the vapor deposition particles 91 entering the mask openings 971. As used herein, "incidence angle" of the vapor deposition particles 91 with respect to a mask opening 971 is defined as the angle formed between the flight direction of the vapor deposition particles 91 entering the mask opening 971 and the Z axis on a projection onto the XZ plane.

As described above, the directivity of the vapor deposition particles 91 in the X axis direction can be improved by using the limiting plate unit 980 including the plurality of limiting plates 981. Accordingly, the width We of the blur portion 90e can be reduced.

With the above-described conventional vapor deposition method described in Patent Document 3, a member corresponding to the limiting plate unit 980 of the new vapor deposition method is not used. Also, vapor deposition particles are discharged from a single slot-shaped opening of the vapor deposition source that extends along the direction orthogonal to the relative movement direction of the substrate. With this configuration, the incidence angle of the vapor deposition particles with respect to the mask opening becomes larger than that in the new vapor deposition method, and therefore detrimental blur occurs at the edge of the coating film.

As described above, according to the new vapor deposition method, the width We of the blur portion 90e at the edge of the coating film 90 to be formed on the substrate 10 can be reduced. Therefore, vapor deposition by color for forming light emitting layers 23R, 23G and 23B using the new vapor deposition method can prevent color mixing from occurring. Accordingly, the pixel pitch can be reduced, and in this case, it is possible to provide an organic EL display device that is capable of displaying high definition images. Meanwhile, the light-emitting region may be enlarged without changing the pixel pitch, and in this case, it is possible to provide an organic EL display device that is capable of displaying high definition images. Also, because it is not necessary to increase the current density in order to increase the brightness, the organic ET, element does not have a short service life and is not easily damaged, and a reduction in reliability can be prevented.

Figure 9B:
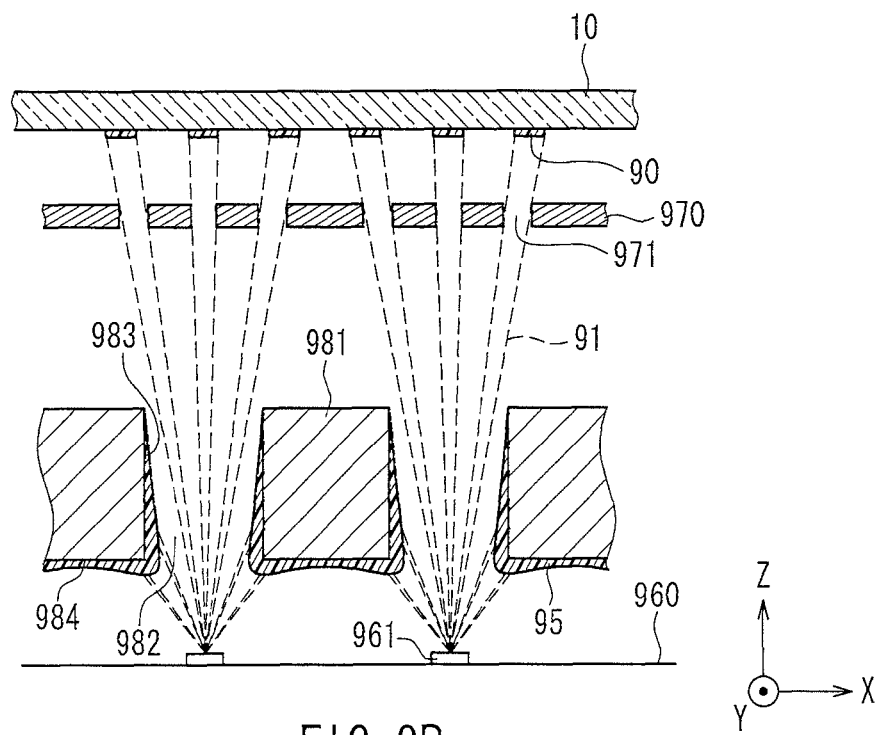
FIG. 9B is an enlarged cross-sectional view illustrating the problem that the vapor deposition material adheres to the limiting plate unit in the new vapor deposition method.

However, if the coating film 90 is formed on the substrate 10 using the new vapor deposition method for a long period, the vapor deposition material 95 adheres to the side surfaces 983 of the limiting plates 981 (surfaces opposing the limiting plates 981 neighboring in the X axis direction) and the undersurfaces 984 of the limiting plates 981 (surfaces opposing the vapor deposition source 960), as shown in FIG. 9B. If the amount of the vapor deposition material adhering to the side surfaces 983 of the limiting plates 981 increases, the interval between the limiting plates 981 neighboring in the X axis direction changes or the characteristics of capturing the vapor deposition particles 92 that collide with the limiting plates 981 decreases. As a result, a desired effect of the limiting plate 981 limiting the incidence angle of the vapor deposition particles 91 with respect to the mask opening 971 will not be achieved. Also, if the resin material adhering to the side surfaces 983 and the undersurfaces 984 of the limiting plates 981 comes off and falls, the inside of the vapor deposition device is contaminated. If the vapor deposition material that comes off falls on the vapor deposition source openings 961, the vapor deposition source openings 961 are blocked with the resin material, and the coating film 90 cannot be formed at a desired position on the substrate 10.

Therefore, with the new vapor deposition method, it is necessary to regularly replace the limiting plate unit 980 to which vapor deposition material has adhered by a new one for cleaning. However, because the limiting plate unit 980 is large and heavy, the operation for replacing it is not easily performed. Also, in the case where a new limiting plate unit 980 is installed, it is necessary to accurately align the position, and moreover the operation for aligning the large and heavy limiting plate unit 980 is not easily performed. Furthermore, in the case where a cooling device for cooling the limiting plate unit 980 is provided in the limiting plate unit 980, it is necessary to re-couple electrical wires, pipes for coolant, and the like of the cooling device. As described above, there is a problem that the operation for replacing the limiting plate unit 980 is significantly complicated, requires much labor and time, resulting in low productivity and a drop in the throughput at the time of mass production.

As described above, the new vapor deposition method has a problem similar to the above-described vapor deposition device of Patent Document 4.

The present inventors conducted an in-depth investigation to solve the above problems encountered with the new vapor deposition method and the present invention has been accomplished. Hereinafter, the present invention will be described using preferred embodiments.

Embodiment 1

Figure 10:
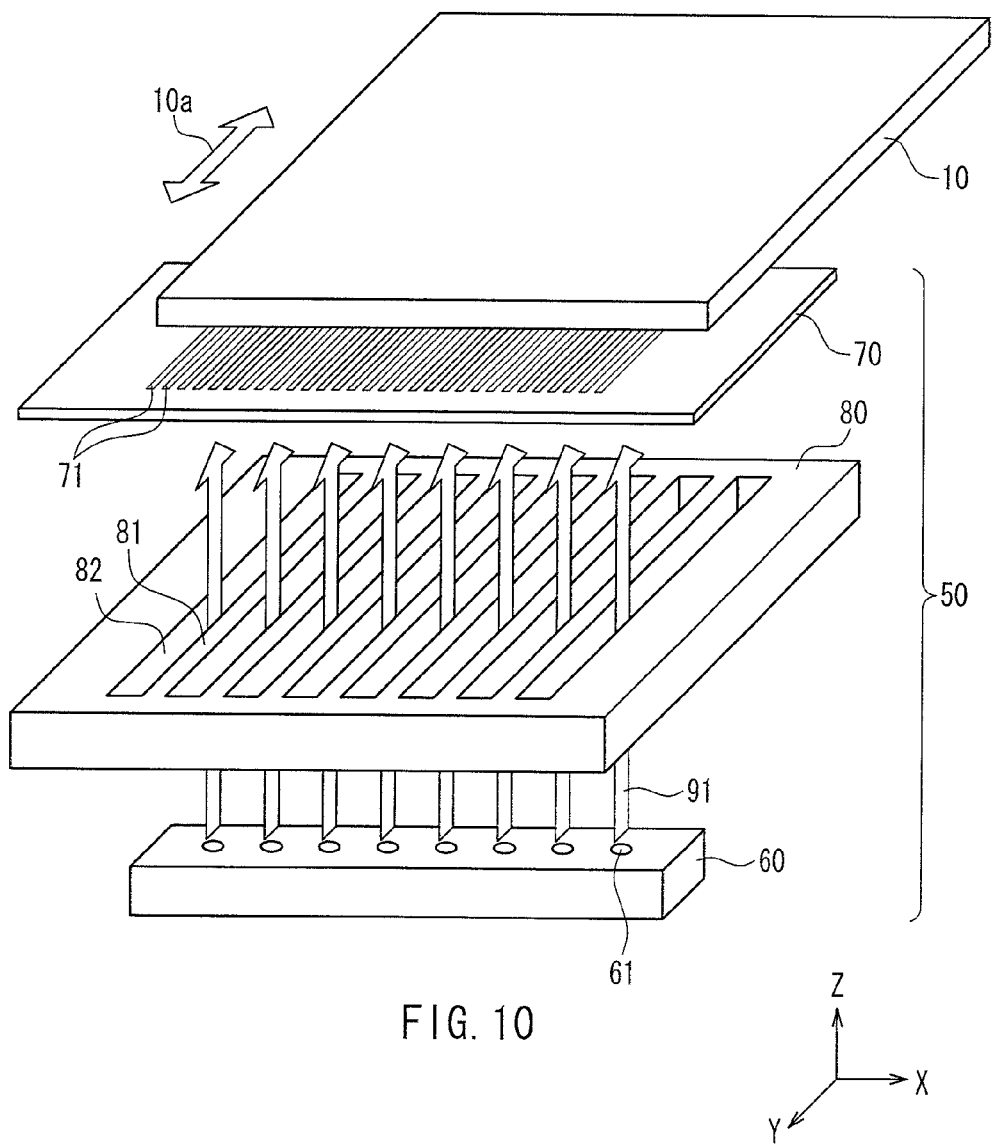
FIG. 10 is a perspective view showing the basic configuration of a vapor deposition device according to Embodiment 1 of the present invention.
Figure 11:
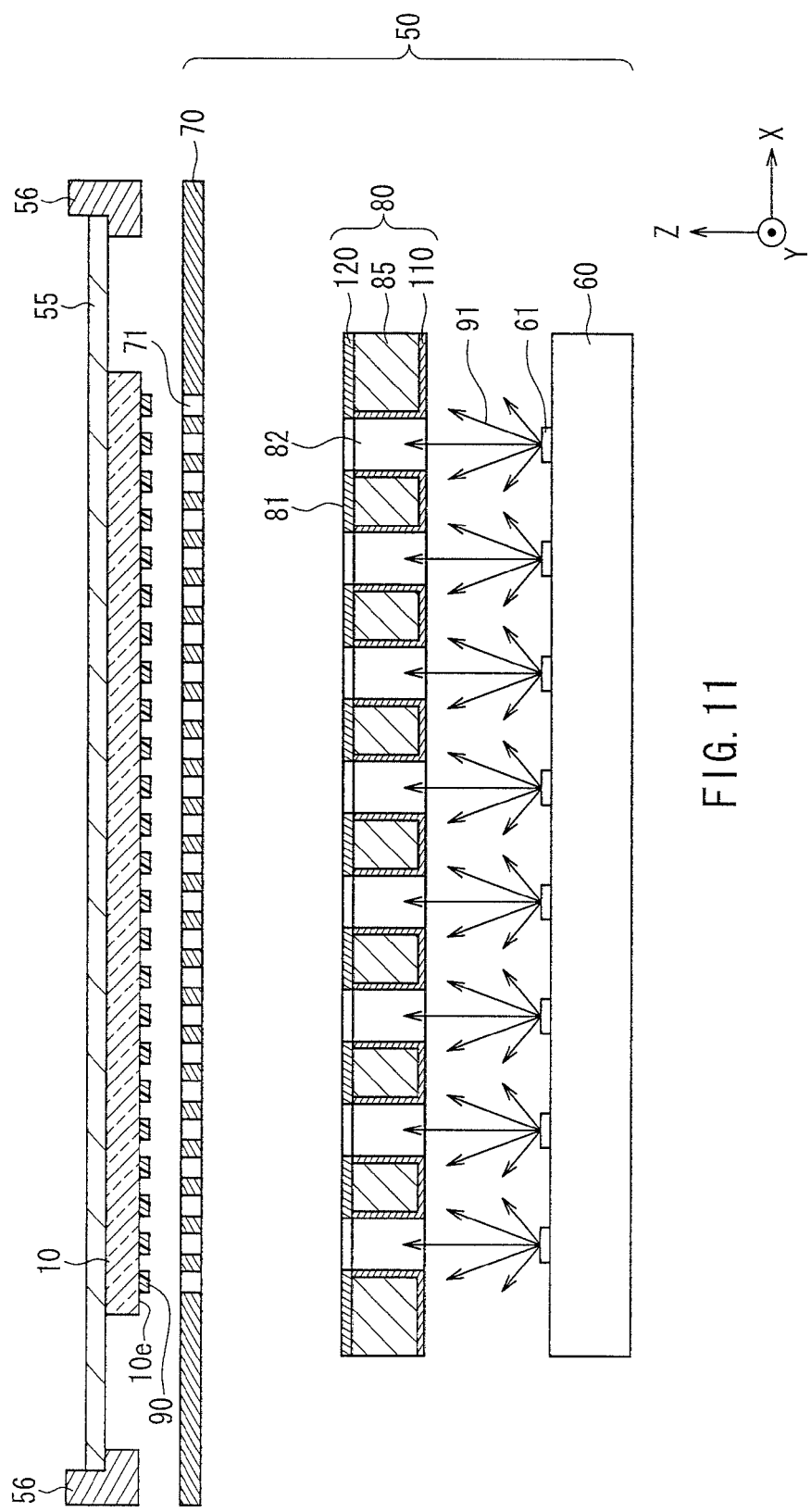
FIG. 11 is a front cross-sectional view of the vapor deposition device shown in FIG. 10 as viewed in a direction parallel to the traveling direction of a substrate.

FIG. 10 is a perspective view showing the basic configuration of a vapor deposition device according to Embodiment 1 of the present invention. FIG. 11 is a front cross-sectional view of the vapor deposition device shown in FIG. 10.

A vapor deposition source 60, a vapor deposition mask 70, and a limiting plate unit 80 disposed therebetween constitute a vapor deposition unit 50. The substrate 10 moves along an arrow 10a at a constant speed with respect to the vapor deposition mask 70 on the opposite side from the vapor deposition source 60. For the sake of convenience of the description given below, an XYZ orthogonal coordinate system is set in which a horizontal axis parallel to the movement direction 10a of the substrate 10 is defined as the Y axis, a horizontal axis perpendicular to the Y axis is defined as the X axis, and a vertical axis perpendicular to the X axis and the Y axis is defined as the Z axis. The Z axis is parallel to the normal line direction of the deposition surface 10e of the substrate 10. To facilitate the description, the side to which the arrow indicating the Z axis points (the upper side of FIG. 11) is referred to the "upper side".

The vapor deposition source 60 has a plurality of vapor deposition source openings 61 in its upper surface (the surface opposing the vapor deposition mask 70). The plurality of vapor deposition source openings 61 are arranged at a fixed pitch along a straight line parallel to the X axis direction. Each vapor deposition source opening 61 has a nozzle shape that is upwardly open parallel to the Z axis and discharges vapor deposition particles 91, which are a light emitting layer-forming material, toward the vapor deposition mask 70.

The vapor deposition mask 70 is a plate-shaped piece that has a major surface (the surface having the largest area) parallel to the XY plane and in which a plurality of mask openings 71 are formed along the X axis direction at different positions in the X axis direction. The mask openings 71 are through holes that penetrate the vapor deposition mask 70 in the Z axis direction. In the present embodiment, each mask opening 71 has an opening shape having a slot shape that is parallel to the Y axis, but the present invention is not limited thereto. All of the mask openings 71 may have the same shape and dimensions, or may have different shapes and dimensions. The pitch in the X axis direction of the mask openings 71 may be constant or different.

It is preferable that vapor deposition mask 70 is held by a mask tension mechanism (not shown). The mask tension mechanism prevents the occurrence of bending or extension of the vapor deposition mask 70 due to its own weight, by applying tension to the vapor deposition mask 70 in a direction parallel to the major surface thereof.

The limiting plate unit 80 is disposed between the vapor deposition source openings 61 and the vapor deposition mask 70. The limiting plate unit 80 includes a plurality of limiting plates 81 arranged at a constant pitch along the X axis direction. The space between the limiting plates 81 neighboring in the X axis direction is a limiting space 82 through which the vapor deposition particles 91 pass. The limiting space 82 is a through hole penetrating the limiting plate unit 80 in the Z axis direction.

In the present embodiment, one vapor deposition source opening 61 is disposed at the center of limiting plates 81 neighboring in the X axis direction. Accordingly, one vapor deposition source opening 61 corresponds to one limiting space 82. However, the present invention is not limited to this, and the plurality of limiting spaces 82 may be configured to correspond to one vapor deposition source opening 61, or one limiting space 82 may be configured to correspond to the plurality of vapor deposition source openings 61. In the present invention, "the limiting space 82 corresponding to the vapor deposition source opening 61" refers to the limiting space 82 that is designed to allow the passage of the vapor deposition particles 91 discharged from the vapor deposition source opening 61.

In FIGS. 10 and 11, although the number of vapor deposition source openings 61 and the number of limiting spaces 82 are eight, the present invention is not limited to this and the number may be larger or smaller than this.

The vapor deposition source opening 61 and the plurality of limiting plates 81 are spaced apart from each other in the Z axis direction, and the plurality of limiting plates 81 and the vapor deposition mask 70 are spaced apart from each other in the Z axis direction. It is preferably that the relative position between the vapor deposition source 60, the limiting plate unit 80, and the vapor deposition mask 70 is substantially constant at least during vapor deposition by color.

The substrate 10 is held by a holding device 55. As the holding device 55, for example, an electrostatic chuck that holds the surface of the substrate 10 opposite to the deposition surface 10e of the substrate 10 with electrostatic force can be used. The substrate 10 can thereby be held substantially without the substrate 10 being bent by its own weight. However, the holding device 55 for holding the substrate 10 is not limited to an electrostatic chuck and may be any other device.

The substrate 10 held by the holding device 55 is scanned (moved) in the Y axis direction at a constant speed by a moving mechanism 56 with respect to the vapor deposition mask 70 on the opposite side from the vapor deposition source 60, with the substrate 10 being spaced apart from the vapor deposition mask 70 at a fixed interval.

The vapor deposition unit 50, the substrate 10, the holding device 55 for holding the substrate 10 and the moving mechanism 56 for moving the substrate 10 are housed in a vacuum chamber (not shown). The vacuum chamber is a hermetically sealed container, with its internal space being vacuumed and maintained to a predetermined low pressure state.

The vapor deposition particles 91 discharged from the vapor deposition source openings 61 pass through a limiting space 82 of the limiting plate unit 80, and a mask opening 71 of the vapor deposition mask 70 in this order. The deposition particles 91 adhere to the deposition surface (specifically, the surface of the substrate 10 opposing the vapor deposition mask 70) 10e of the substrate 10 traveling in the Y axis direction to form a coating film 90. The coating film 90 has a stripe shape extending in the Y axis direction.

The vapor deposition particles 91 that form the coating film 90 necessarily pass through the limiting space 82 and the mask opening 71. The limiting plate unit 80 and the vapor deposition mask 70 are designed so as to prevent a situation in which the vapor deposition particles 91 discharged from a vapor deposition source opening 61 reach the deposition surface 10e of the substrate 10 without passing through the limiting spaces 82 and the mask openings 71, and if necessary, a shielding plate (not shown) or the like that prevents flight of the vapor deposition particles 91 may be installed.

By performing vapor deposition three times by changing the vapor deposition material 91 for each color, namely, red, green and blue (vapor deposition by color), stripe-shaped coating films 90 (specifically, light emitting layers 23R, 23G and 23B) that correspond to the respective colors of red, green and blue can be formed on the deposition surface 10e of the substrate 10.

As with the limiting plates 981 of the new vapor deposition method shown in FIGS. 5 and 6, the limiting plates 81 limit the incidence angle of the vapor deposition particles 91 entering the mask openings 71 on a projection onto the XZ plane by causing the vapor deposition particles 91 having a large speed vector component in the X axis direction to collide with and adhere to the limiting plates 81. As used herein, "incidence angle" of the vapor deposition particles 91 with respect to a mask opening 71 is defined as the angle formed between the flight direction of the vapor deposition particles 91 entering the mask opening 71 and the Z axis on a projection onto the XZ plane. As a result, the amount of the vapor deposition particles 91 that pass through a mask opening 71 at a large incidence angle is reduced. Accordingly, the width We of the blur portion 90e shown in FIG. 8 is reduced, and thus the occurrence of blur at both edges of the stripe-shaped coating film 90 can be suppressed significantly.

In order to limit the incidence angle at the vapor deposition particles 91 enter the mask opening 71, the limiting plates 81 are used in the present embodiment. The dimension in the X axis direction of a limiting space 82 can be large, and the dimension in the Y axis direction can be set to substantially any value. Accordingly, the opening area of the limiting space 82 viewed from the vapor deposition source openings 61 is increased, and thus the amount of vapor deposition particles that adhere to the limiting plate unit 80 can be reduced as compared with the valor deposition beam direction adjustment plate of Patent Document 4, as a result of which the wasted vapor deposition material can be reduced. Also, clogging caused as a result of the vapor deposition material adhering to the limiting plates 81 is unlikely to occur, enabling continuous use for a long period of time and improving the mass productivity of the organic EL display device. Furthermore, because the opening area of the limiting plate 82 is large, the vapor deposition material that has adhered to the limiting plates 81 can be easily washed off, enabling simple maintenance and reducing the losses resulting from a stop of mass production, as a result of which the mass productivity can be further improved.

Figure 12:
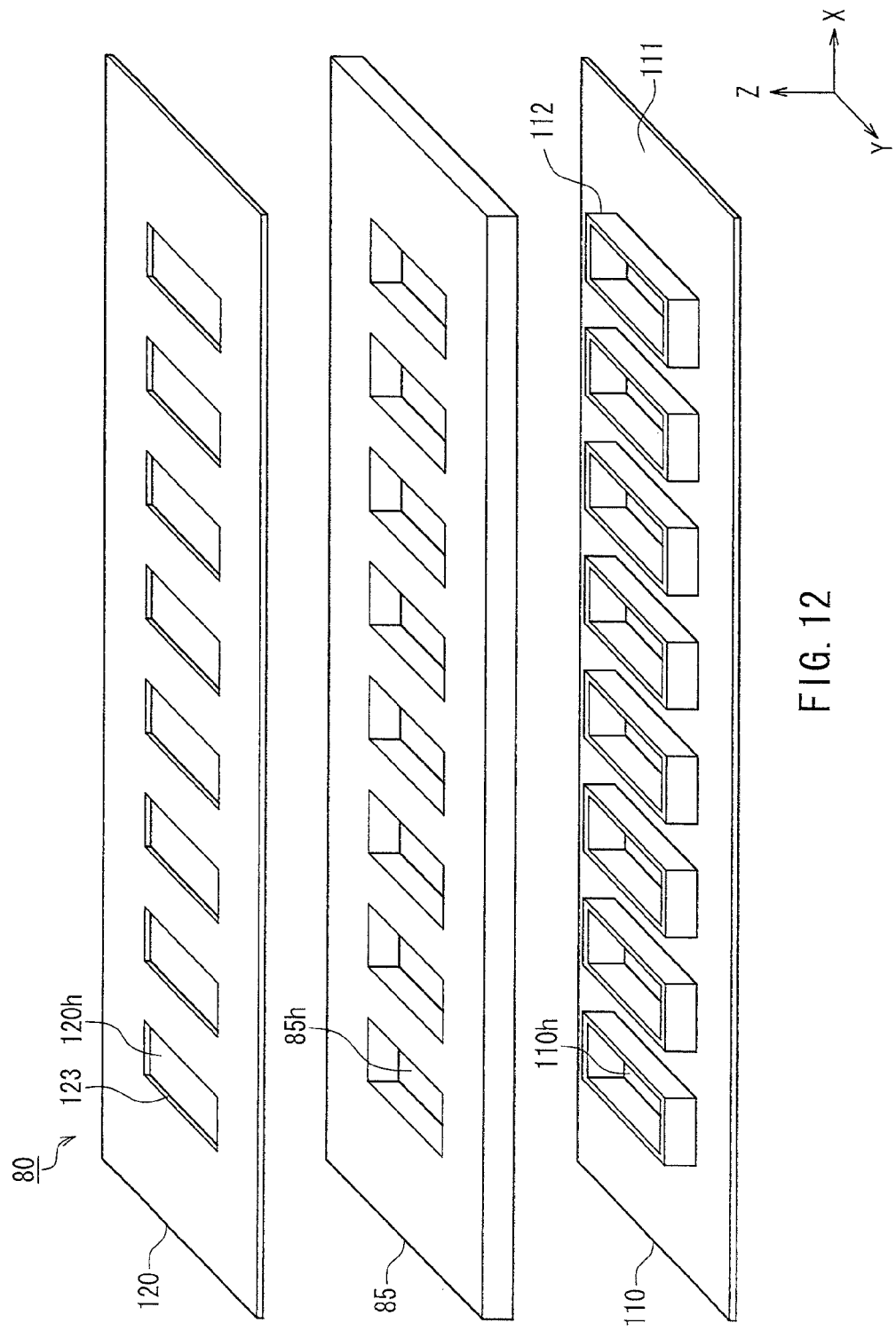
FIG. 12 is an exploded perspective view of a limiting plate unit that constitutes a vapor deposition device according to Embodiment 1 of the present invention.

FIG. 12 is an exploded perspective view of the limiting plate unit 80. As shown in FIGS. 11 and 12, the limiting plate unit 80 is configured with a first outer surface member 110, a cooling block (base portion) 85, and a second outer surface member 120 which are overlaid one upon another in this order in the Z axis direction from the side of the vapor deposition source 60 toward the side of the vapor deposition mask 70.

The first outer surface member 110 includes a plate-shaped portion 111 constituted by a thin plate parallel to the XY plane and a tubular body 112 having a hollow rectangular columnar shape. A through hole 110h is formed in the plate-shaped portion 111 of the first outer surface member 110 at a position corresponding to the limiting space 82 of the limiting plate unit 80. The tubular body 112 extends upright from the edge of the opening of each through hole 110h toward the cooling block 85.

The cooling block 85 accommodates a cooling device (not shown) for cooling the control plate unit 80 so that the limiting plate unit 80 is not heated to a high temperature from receiving radiant heat from the vapor deposition source 60. Although there is no particular limitation to a cooling method, a method using a coolant (for example, water), a method using a cooling element such as a Peltier element or the like, and the like can be arbitrarily selected. A pipe for coolant, an electrical wire for a cooling element, and the like are connected to the cooling block 85 depending on the cooling method (not shown). The cooling block 85 occupies a relatively large volume and weight of the limiting plate unit 80 in order to increase the amount of heat capacity thereof and because it includes the pipe for coolant, the cooling element, and the like. A through hole 85h is formed in the cooling block 85 at a position corresponding to the limiting space 82 of the limiting plate unit 80.

The second outer surface member 120 is constituted by a thin plate and a through hole 120h is formed therein at a position corresponding to the limiting space 82 of the limiting plate unit 80.

It is preferable that the first outer surface member 110, the second outer surface member 120, and the cooling block 85 are made of a material having high thermal conductivity characteristics in order to improve the cooling performance, and for example, metal materials such as aluminum, copper, stainless steel, and the like can be used.

It is preferable that the first and second outer surface members 110 and 120 are in close contact with the cooling block 85 without any gap therebetween, in order to facilitate thermal conduction from the first and second outer surface members 110 and 120 to the cooling block 85. It is preferable that the surfaces of the first and second outer surface members 110 and 120 and the cooling block 85 that make contact with one another are smooth.

On the other hand, it is preferable that the surfaces of the first and second outer surface members 110 and 120 (in particular, the first outer surface member 110) to which a resin material adheres (the surface on the side opposite to the cooling block 85) are roughened in order to improve the performance of capturing the vapor deposition particles 91 colliding therewith. Although there is no particular limitation on a roughening method, a known method such as a chemical process using a chemical or the like, a mechanical process, for example, blasting, and so on can be used.

Figure 13:
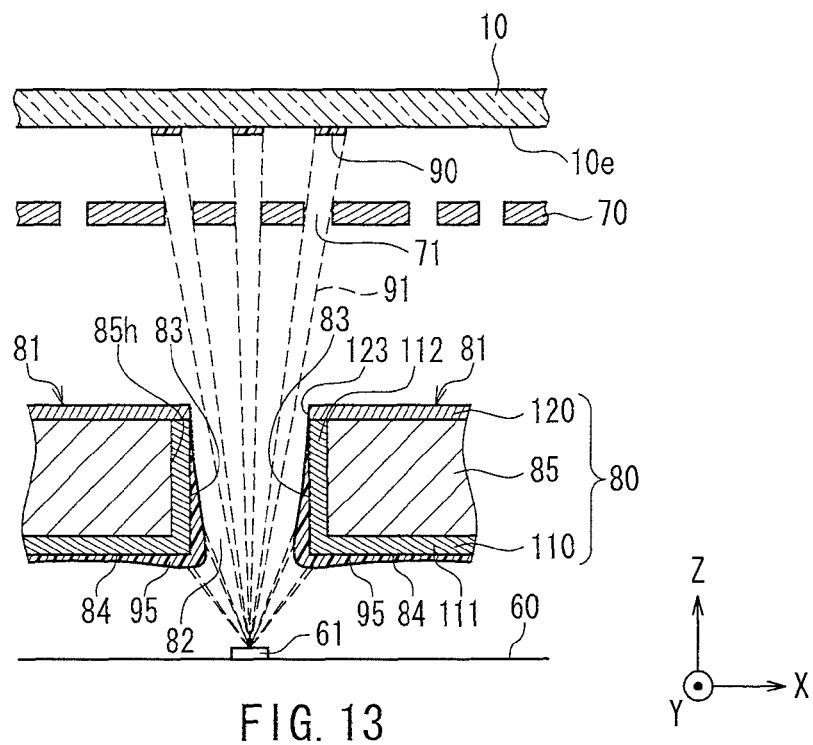
FIG. 13 is an enlarged cross-sectional view showing the configuration of the periphery of one limiting space in the vapor deposition device according to Embodiment 1 of the present invention.

FIG. 13 is an enlarged cross-sectional view showing the configuration of the periphery of one limiting space 82 in the vapor deposition device according to Embodiment 1. As can be understood from FIG. 13, the tubular body 112 of the first outer surface member 110 is inserted into the through hole 85h of the cooling block 85, and the upper end surface of the tubular body 112 is in contact with the undersurface of the edge 123 defining the through hole 120h of the second outer surface member 120. As a result, the surfaces defining the limiting space 82 in the X axis direction and in the Y axis direction are constituted by the inner circumferential surface of the tubular body 112 of the first outer surface member 110 and the inner circumferential surface of the edge 123 of the through hole 120h of the second outer surface member 120. Also, the undersurface of the limiting plate unit 80 (the surface opposing the vapor deposition source 60) is configured by the plate-shaped portion 111 of the first outer surface member 110. The upper surface of the limiting plate unit 80 (the surface opposing the vapor deposition mask 70) is configured by the second outer surface member 120. In other words, the cooling block 85 is covered by the first outer surface member 110 and the second outer surface member 120, except for the end surfaces in the X axis direction and the Y axis direction.

The cooling block 85 is fixed to the vapor deposition device of the present embodiment. A mechanism for finely adjusting the positions of the cooling block 85 in the XYZ directions may be provided. The limiting plate unit 80 of the present embodiment can be assembled by overlaying on the cooling block 85 fixed in this manner the first outer surface member 110 from therebelow, and the second outer surface member 120 from thereabove. Also, the first outer surface member 110 and the second outer surface member 120 can be separated from the cooling block 85 by performing the opposite operation from this.

A fixing member (for example, a clamping device, a screw, or the like) for fixing the first outer surface member 110 and the second outer surface member 120 to the cooling block 85 so as to be capable of attaching thereto and detaching therefrom may be provided in the limiting plate unit 80.

Similarly to the description of FIG. 9B, also in the present embodiment, if vapor deposition is performed for a long period, the vapor deposition material 95 adheres to the limiting plate unit 80. As shown in FIG. 13, the vapor deposition material 95 mainly adheres to the surfaces defining the limiting space 82 (in particular, the side surfaces 83 of the limiting plates 81 defining the limiting space 82 in the X axis direction) and the undersurfaces (surfaces opposing the vapor deposition source 60) 84 of the limiting plates 81.

In the limiting plate unit 80 of the present embodiment, the first outer surface member 110 and the second outer surface member 120 that cover the outer surfaces of the cooling block 85 serving as the base portion can be attached thereto and detached therefrom. Therefore, in the case where a large amount of the vapor deposition material 95 adheres to the first and second outer surface members 110 and 120, only the first outer surface member 110 and the second outer surface member 120 are replaced by new ones with the cooling block 85 remaining inside the vapor deposition device. As described above, the outer surfaces of the cooling block 85 are almost completely covered by the first outer surface member 110 and the second outer surface member 120, and therefore a resin material does not significantly adhere to the outer surfaces of the cooling block 85.

The first outer surface member 110 and the second outer surface member 120 are significantly lighter in weight than the cooling block 85. Therefore, the operation for replacing the first outer surface member 110 and the second outer surface member 120 is significantly easier than the operation for replacing the entire limiting plate unit 80. Also, the first outer surface member 110 and the second outer surface member 120 attached to the outer surfaces of the cooling block 85 that is not replaced need only be replaced by new ones, and therefore the operation for alignment along with the replacement is easier than the operation for replacing the entire limiting plate unit 80, even though some fine adjustment may be required. Furthermore, a pipe for coolant, an electrical wire, and the like for cooling the limiting plate unit 80 are not connected to the first outer surface member 110 and the second outer surface member 120, and therefore it is not necessary to re-couple (disconnect and reconnect) the pipes for coolant, the electrical wires for a cooling element, and the like if the first outer surface member 110 and the second outer surface member 120 are replaced.

Therefore, according to the present embodiment, it is possible to easily perform the operation for regenerating the limiting plate unit 80 (the operation for replacing the first outer surface member 110 and the second outer surface member 120) when the resin material 95 has adhered thereto, in a short time. As a result, the productivity and the throughput at the time of mass production are improved.

With the present embodiment, the first outer surface member 110 and the second outer surface member 120 can be easily replaced, and therefore it is possible to increase the frequency of the replacement without reducing the productivity. Therefore, it is possible to always keep the limiting plate unit 80 in a clean state in which only a small amount of the resin material 95 adheres thereto. Accordingly, the interval between the limiting plates 81 neighboring in the X axis direction can be kept at a value as intended. Also, it is possible to prevent the characteristics of capturing the vapor deposition particles 91 colliding with the limiting plates 81 from decreasing. Therefore, it is possible to make always effective the desired effects of the limiting plates 81 limiting the incidence angle of the vapor deposition particles 91 with respect to the mask opening 81. Furthermore, re-vaporization of the vapor deposition material 95 adhering to the vapor deposition unit 80 can be suppressed. As a result, it is possible to stably maintain the accuracy in the pattern of the coating film 90 to be formed by vapor deposition at a high level.

Also, the limiting plate unit 80 can be kept in a clean state in which only a small amount of the resin material 95 adheres thereto, and therefore it is possible to reduce the occurrence of the problem that the resin material 95 adhering to the limiting plate unit 80 comes off, falls, and contaminates the inside of the vapor deposition device, or the resin material falls off and blocks the vapor deposition source openings 61.

In the normal maintenance operation for replacing the first outer surface member 110 and the second outer surface member 120, it is not necessary to detach the cooling block 85 from the vapor deposition device. Therefore, as compared with the case where the entire limiting plate unit is replaced when the resin material has adhered, it is not necessary to take operability for replacing the cooling block 85 into consideration when designing the limiting plate unit 80, and the limiting plate unit 80 can be designed so as to have a priority for improving the cooling performance. As a result, the performance of cooling the limiting plate unit 80 can be improved, and therefore, for example, the characteristics of capturing the vapor deposition particles 91 colliding with the limiting plates 81 can be improved and also the re-vaporization of the vapor deposition material 95 adhering to the limiting plates 81 can be reduced. Accordingly, it is possible to improve the accuracy in the pattern of the coating film 90 to be formed by vapor deposition.

The resin material 95 that has adhered to the first outer surface member 110 and the second outer surface member 120 detached from the cooling block 85 can be recovered and reused as a vapor deposition material for forming the coating film 90. The first outer surface member 110 and the second outer surface member 120 are light in weight and pipes for a coolant, cooling elements and the like are not mounted thereon, and therefore the operation for recovering the resin material 95 that has adhered to the first outer surface member 110 and the second outer surface member 120 is significantly easier than the operation for detaching the entire limiting plate unit 80 and then recovering the resin material 95. Therefore, it is possible to effectively use the resin material, and to reduce material loss and vapor deposition cost.

The first outer surface member 110 integrally includes the plate-shaped portion 111 constituting the undersurface of the limiting plate unit 80 and the tubular bodies 112 defining the limiting space 82. Among the outer surfaces of the limiting plate unit 80, the region to which the largest amount of the resin material 95 adheres is configured by one member (first outer surface member 110), and therefore the member to which a large amount of the resin material 95 adheres can be handled integrally with the resin material 95 adhering thereto without dividing the member. Therefore, the operability of replacement is excellent. Also, the problem is not likely to occur that at the time of performing the operation for replacing the first outer surface member 110, the resin material 95 adhering to the first outer surface member 110 is damaged and falls off, resulting in the contamination of the vapor deposition device, and the like.

The first outer surface member 110 and the second outer surface member 120 are separated members, and therefore only one of them can be replaced. For example, it is possible to only replace the first outer surface member 110 to which a large amount of the resin material 95 has adhered without replacing the second outer surface member 120 to which a small amount of the resin material 95 has adhered. The edge 123 of the through hole 120h of the second outer surface member 120 limits the flight direction of the vapor deposition particles 91, and therefore it is necessary for the second outer surface member 120 to have high accuracy in the X axis position. In the case where the second outer surface member 120 is not replaced, the operation for aligning the second outer surface member 120 with high accuracy is not required and the flight directions of the vapor deposition particles 91 do not change. Even if the first outer surface member 110 for which relatively low accuracy in the position is acceptable is replaced, the operation for alignment along with the replacement is easy and is ended in a short time. Therefore, it is possible to further simplify the replacement operation.

In the present embodiment, the edge 123 of the through hole 120h of the second outer surface member 120 constitutes the edge of the side surface 83 of the limiting plate 81 on the side of the vapor deposition mask 70 (hereinafter, referred to as "mask side end of the side surface 83"). As can be understood from FIG. 13, the mask openings 71 that the vapor deposition particles 91 discharged from the vapor deposition source openings 61 enter are selected, depending on the position of the mask side end of the side surface 83 of the limiting plate 81 (particularly, the position in the X axis direction). Therefore, relatively high accuracy in the position of the mask side end of the side surface 83 of the limiting plate 81 is required. As in the present embodiment, the accuracy in a desired position of the mask side end of the side surface 83 of the limiting plate 81 can be easily ensured by the mask side end of the side surface 83 of the limiting plate 81 being configured by the second outer surface member 120 which is a different member from the first outer surface member 110.

Also, the mask side end of the side surface 83 of the limiting plate 81 is configured by the removable second outer surface member 120, and therefore a plurality of types of the second outer surface members 120 that have different opening widths of the through holes 120h in the X axis direction and different positions thereof in the X axis direction may be produced in advance, an optimal second outer surface member 120 may be used for replacement, in accordance with any change of model of an organic EL display device to be produced, time-dependent fluctuation in the degree of spread (directivity) of the vapor deposition particles 91 discharged from the vapor deposition source openings 61, variation between vapor deposition source openings 61, variation in the positions of the vapor deposition source openings 61 in the X axis direction, and the like. As described above, vapor deposition conditions can be changed with a simple operation for replacing the second outer surface member 120, and therefore the losses resulting from a stop of the vapor deposition device are reduced and the productivity is improved.

Figure 14:
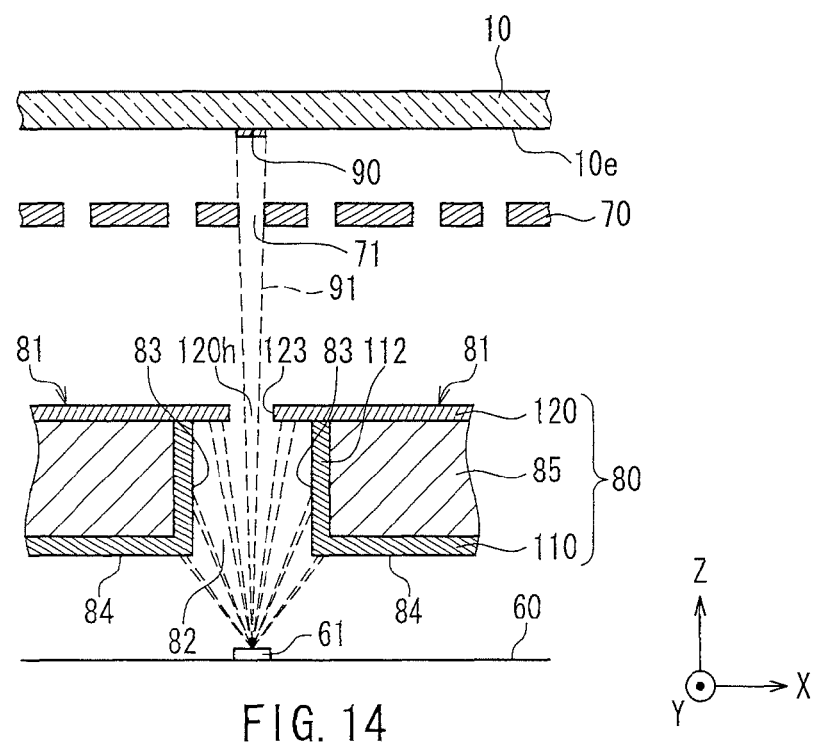
FIG. 14 is an enlarged cross-sectional view of the vapor deposition device according to Embodiment 1 of the present invention in which the flow width of the vapor deposition particles passing through the limiting space is limited by replacing a second outer surface member of the limiting plate unit.

For example, as shown in FIG. 14, the second outer surface member 120 may be replaced by a member that has the through holes 120h whose opening width is narrow in the X axis direction, and the edge 123 of the through hole 120h of the second outer surface member 120 may be protruded inside the limiting space 82 from the tubular body 112 of the first outer surface member 110. Accordingly, the flow of the vapor deposition particles passing through the limiting space 82 in the X axis direction is reduced so that the pattern of the coating film 90 to be formed on the substrate 10 can be changed.

Note that although not shown, the position at which the second outer surface member 120 is attached to the cooling block 85 may be changed in the X axis direction so as to change the position of the through hole 120h in the X axis direction. In this case, the direction of the vapor deposition particle flow passing through the limiting space 82 can be arbitrarily changed, and therefore among the mask openings 71 formed on the vapor deposition mask 70, those that the vapor deposition particles 91, passing through the limiting space 82, enter can be changed. As a result, the position of the coating film 90 in the X axis direction to be formed on the substrate 10 can be changed.

As in FIG. 14, if the edge 123 of the through hole 120h of the second outer surface member 120 protrudes inside the limiting space 82, the vapor deposition material adheres to the undersurface of the edge 123. However, actually, the amount of the protrusion is not significant and also the second outer surface member 120 is replaceable, and therefore generally there is little possibility that the vapor deposition material adhering to the second outer surface member 120 causes problems.

Figure 15A:
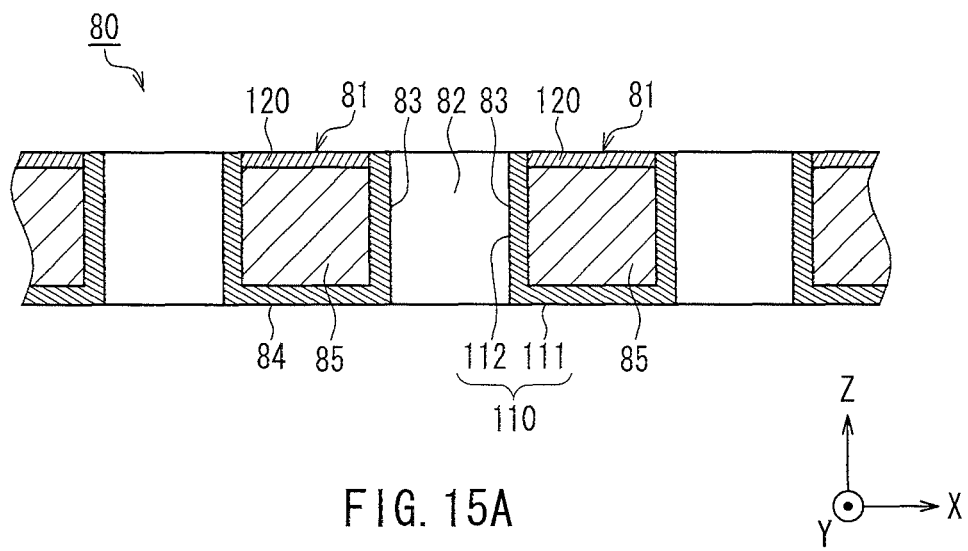
FIG. 15A is an enlarged cross-sectional view of another limiting plate unit to be provided in the vapor deposition device according to Embodiment 1 of the present invention.
Figure 15B:
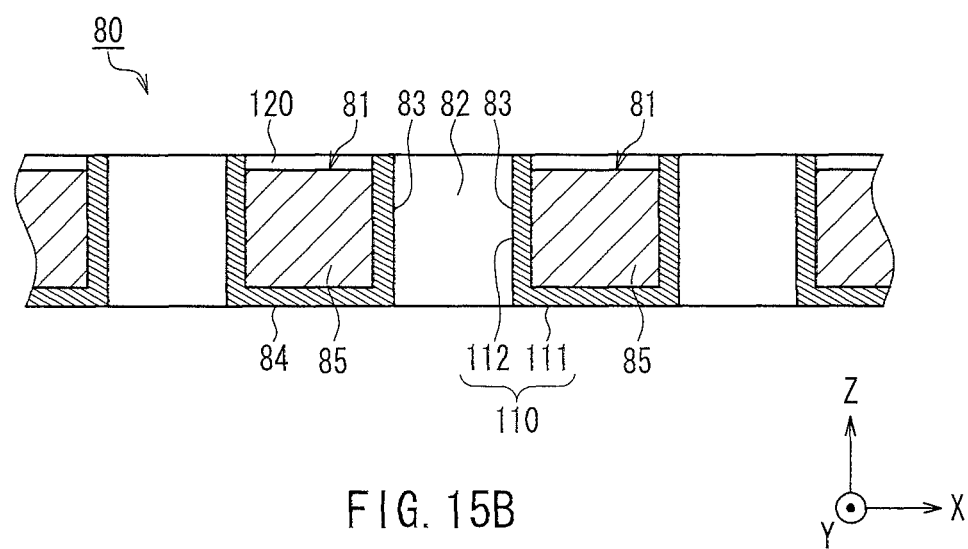
FIG. 15B is an enlarged cross-sectional view of still another limiting plate unit to be provided in the vapor deposition device according to Embodiment 1 of the present invention.

Although in the above-described example, a portion of the wall surfaces defining the limiting space 82 in the X axis direction and the Y axis direction is configured by the edge 123 of the through hole 120h of the second outer surface member 120, the configuration such as shown in FIGS. 15A and 15B can be adopted in the case where it is not necessary to define or change the opening width of the limiting space 82 with the edge 123 of the through hole 120h of the second outer surface member 120.

In other words, as shown in FIG. 15A, the entire wall surfaces defining the limiting space 82 in the X axis direction and the Y axis direction may be configured by the inner circumferential surface of the tubular body 112 of the first outer surface member 110, and the second outer surface member 120 may be simply used to cover only the upper surface of the cooling block 85.

Alternatively, as shown in FIG. 15B, the second outer surface member 120 may be omitted. In this case, the upper surface of the cooling block 85 is exposed. However, the amount of the vapor deposition material adhering to the upper surface of the cooling block 85 is relatively small, and moreover even if the vapor deposition material adheres to the upper surface thereof, the vapor deposition material hardly becomes a problem in the formation of the coating film 90. The number of members constituting the limiting plate block 80 is reduced by omitting the second outer surface member 120, and therefore the device cost can be reduced.

Although in the above-described embodiment, the first outer surface member 110 and the second outer surface member 120 are single members respectively, the present invention is not limited to this, and at least one of the first outer surface member 110 and the second outer surface member 120 may be divided into a plurality of segments. For example, in the case where the dimension of the limiting plate unit 80 in the X axis direction is large, the first outer surface member 110 and the second outer surface member 120 may be divided into a plurality of segments in the X axis direction, taking the operability of replacement into consideration. Similarly, the cooling block 85 may be divided into a plurality of segments.

Embodiment 2

Embodiment 2 is different from Embodiment 1 in the configuration of the limiting plate unit 80. Hereinafter, Embodiment 2 will be described, focusing on the difference from Embodiment 1.

Figure 16A:
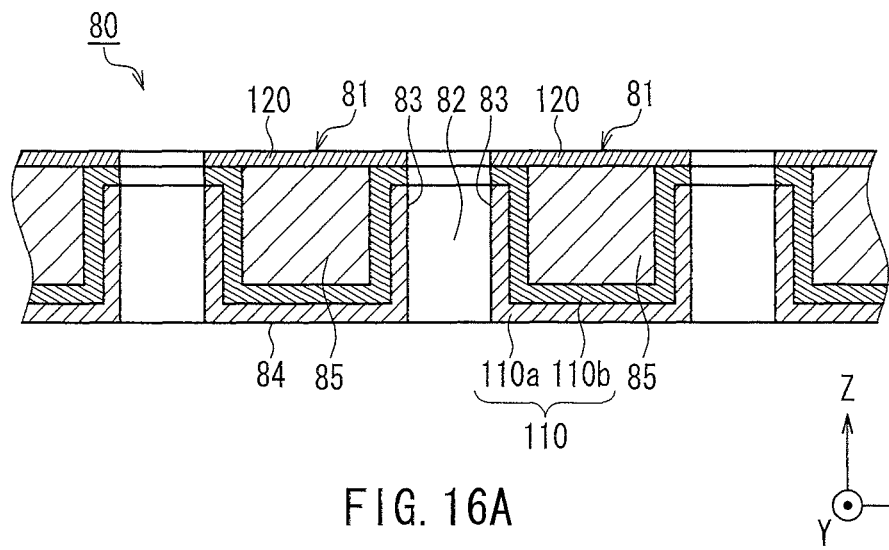
FIG. 16A is an enlarged cross-sectional view of a limiting plate unit to be provided in the vapor deposition device according to Embodiment 2 of the present invention.
Figure 16B:
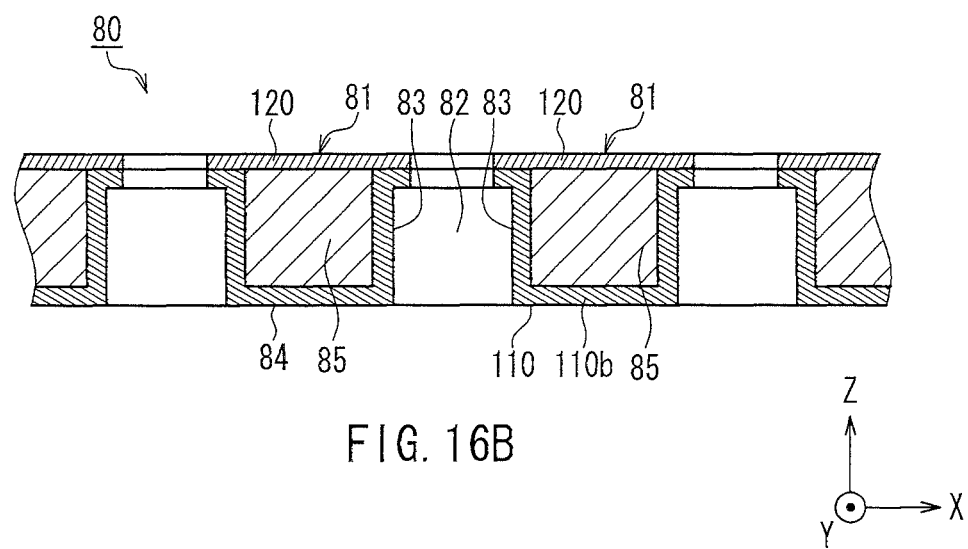
FIG. 16B is an enlarged cross-sectional view of the limiting plate unit of FIG. 16A without the surface layer of a first outer surface member.

FIG. 16A is an enlarged cross-sectional view of a limiting plate unit 80 to be provided in a vapor deposition device according to Embodiment 2. In Embodiment 2, the first outer surface member 110 has a two-layer structure constituted by a first layer 110a which is a surface layer and a second layer 110b which is an underlayer. As shown in FIG. 16B, the first layer 110a which is a surface layer may be removed, and furthermore the second layer 110b which is an underlayer may be removed.

In the present embodiment, if a resin material adheres to the surface of the first layer 110a of the first outer surface member 110 as a result of vapor deposition, only the first layer 110a is first removed along with the resin material. Thereafter, vapor deposition is further performed, and if the resin material adheres to the surface of the second layer 110b, the second layer 110b is removed and a first outer surface member 110 having a new two-layer structure is attached thereto.

According to the present embodiment, when the first layer 110a is removed, the operation for attaching another new member after the removal is not required. Therefore, the operation is simple and is ended in a short time. As a result, as compared with Embodiment 1 in which two steps for detachment and attachment are always required, the productivity and the throughput at the time of mass production are further improved. Also, the frequency at which the operation for regenerating the limiting plate unit 80 is performed can be further increased more than Embodiment 1, without reducing the productivity.

Although the case where the first outer surface member 110 has a two-layer structure has been described in the above-described example, the first outer surface member 110 may have a multilayer structure having three layers or more. It is sufficient that only a layer is detached regardless of the number of layers, except when the undermost layer is detached. Therefore, as the number of layers is increased, a great effect of improving the productivity is obtained.

In the present embodiment, there is no particular limitation on materials for each layer. All layers may be made of the same material (for example, metal material), or may be made of different materials For example, the undermost layer (the second layer 110b in the example of FIG. 16A) may only be produced using a material having rigidity (for example, metal material described in Embodiment 1), and other layers may be sheets (or films) made of a material having flexibility such as resin material. In this case, it is possible to remove layers other than the undermost layer through a simple operation in which each sheet is peeled away, and therefore the productivity is further improved. Also, a resin sheet can be generally made thinner than a metal plate, and therefore the number of layers of the first outer surface member 110 can be easily increased. Of course, all layers of the first outer surface member 110 may be configured by sheets (or films) made of a material having flexibility such as resin material.

Although in the above-described example, the entire surface of the first outer surface member 110 has a multilayer structure, the present invention is not limited to this. For example, a multilayer structure may only be applied to a region to which a large amount of the resin material 95 adheres or a partial region such as the region where layers can be relatively easily removed, or the like.

It is also possible to apply the above-described multilayer structure to the second outer surface member 120.

Embodiment 3

Embodiment 3 is different from Embodiment 1 in the configuration of the limiting plate unit 80. Hereinafter, Embodiment 3 will be described, focusing on the difference from Embodiment 1.

Figure 17:
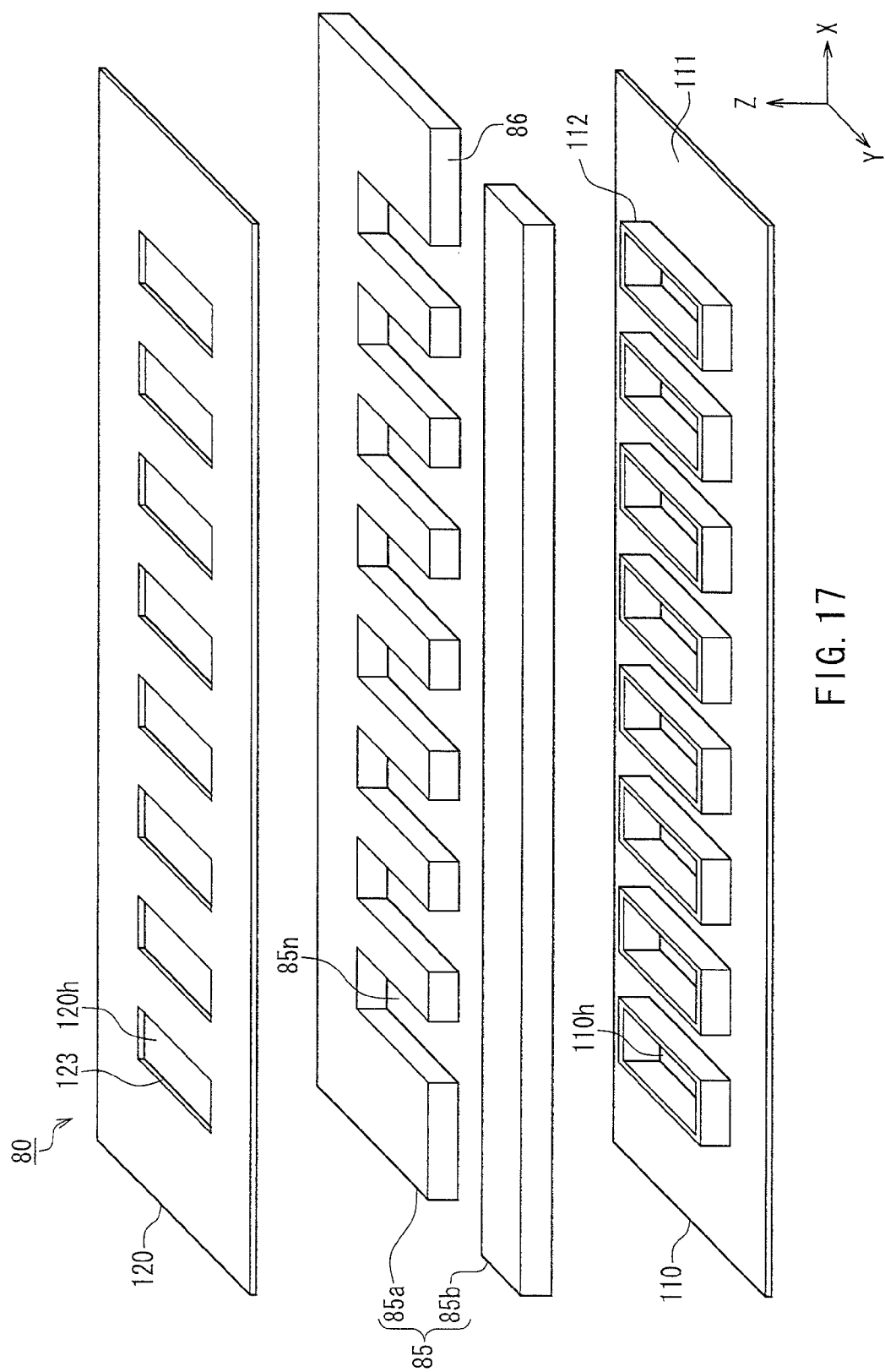
FIG. 17 is an exploded perspective view of a limiting plate unit that constitutes a vapor deposition device according to Embodiment 3 of the present invention.

FIG. 17 is an exploded perspective view of a limiting plate unit 80 that constitutes a vapor deposition device according to Embodiment 3. In Embodiment 3, the cooling block 85 can be divided into two parts in the Y axis direction, namely a main portion 85a and a sub portion 85b. In other words, the cooling block 85 of Embodiment 3 has a similar shape to the shape obtained by dividing the cooling block 85 of Embodiment 1 (see FIG. 12) along a division plane 86 parallel to the X axis passing across the through holes 85h. Therefore, notches 85n opening in the Y axis direction are formed in the main portion 85a. When the main portion 85a and the sub portion 85b are joined on the division plane 86, the notch 85n becomes a through hole like the through hole 85 of the cooling block 85 of Embodiment 1.

In Embodiment 3, the main portion 85a of the cooling block 85 is fixed to the vapor deposition device. A mechanism for finely adjusting the positions of the main portion 85a in the XYZ directions may be provided. The limiting plate unit 80 of Embodiment 3 can be assembled by assembling the first outer surface member 110, the second outer surface member 120, and the sub portion 85b into the main portion 85a fixed in this manner.

In Embodiment 3, in order to separate the first outer surface member 110 from the cooling block 85, the sub portion 85b firstly is moved relative to the main portion 85a along the Y axis direction and is separated therefrom. Next, the first outer surface member 110 is moved relative to the main portion 85a along the Y axis direction in the same direction as the direction of the sub portion 85b movement. Because the notches 85n are open in the Y axis direction as described above, if the first outer surface member 110 is moved along the Y axis direction in the same direction as the direction of the sub portion 85b separation, the tubular body 112 of the first outer surface member 110 can be drawn from the notch 85n.

In the case where the first outer surface member 110 is assembled into the cooling block 85, the opposite operation to the above-described operation need only be performed. Specifically, in a state in which the sub portion 85b is not attached to the cooling block 85, the first outer surface member 110 is moved relative to the main portion 85a along the Y axis direction such that the tubular body 112 of the first outer surface member 110 is inserted into the notch 85n. Thereafter, the sub portion 85b is joined to the main portion 85a on the division plane 86.

In contrast, in Embodiment 1, in order to separate the first outer surface member 110 from the cooling block 85, it is necessary that the first outer surface member 110 firstly is moved downward along the Z axis direction (toward the vapor deposition source 60) until the tubular body 112 of the first outer surface member 110 escapes from the through hole 85h of the cooling block 85, and then the first outer surface member 110 is moved along the Y axis direction so as to be drawn out between the cooling block 85 and the vapor deposition source 60. In the case where the interval between the cooling block 85 and the vapor deposition source 60 is so narrow that the tubular body 112 cannot escape from the through hole 85h, it is necessary to move the cooling block 85 upward (toward the vapor deposition mask 70).

In Embodiment 1, in the case where the first outer surface member 110 is assembled into the cooling block 85, the opposite operation to the above-described operation is performed.

As described above, in Embodiment 1, in the case of replacing the first outer surface member 110, the first outer surface member 110 needs to be moved in the two directions of the Z axis direction and the Y axis direction. Furthermore, in some cases, the cooling block 85 needs to be moved in the Z axis direction.

As can be understood by comparing with Embodiment 1, in Embodiment 3, the cooling block 85 is divided along the division plane 86 passing across the through holes 85h, and therefore in order to replace the first outer surface member 110, the first outer surface member 110 need only be moved along the Y axis direction and it is not substantially necessary to move the first outer surface member 110 or the main portion 85a in the Z axis direction. Therefore, according to Embodiment 3, it is possible to more easily perform the operation for replacing the first outer surface member 110 in a shorter time than in Embodiment 1. As a result, the productivity and the throughput at the time of mass production are improved.

In Embodiment 3, it is necessary to divide the cooling block 85 of Embodiment 1. However, for example, if the division plane 86 is provided at a position so as to extend along one surface of substantially rectangular columnar surfaces defining the through hole 85h as shown in FIG. 17, it is sufficient that only one division surface is provided at a position around the cooling block 85. Therefore, it is possible to reduce a drop in the performance of cooling the limiting plate unit 80 due to the division of the cooling block 85.

In Embodiment 3, the operation for replacing the second outer surface member 120 is the same as Embodiment 1.

In the above-described example, the sub portion 85b of the cooling block 85 may be integrated with first outer surface member 110. In this case, in order to separate the first outer surface member 110 from the cooling block 85, the integrated article of the sub portion 85b and the first outer surface member 110 may only be moved relative to the main portion 85a along the Y axis direction and separated therefrom. In other words, the step of moving only the sub portion 85b relative to the main portion 85a along the Y axis direction for separation is not required, and therefore the operation for replacing the first outer surface member 110 can be more performed in a shorter time.

In Embodiment 3, the first outer surface member 110 and/or the second outer surface member 120 may have multilayer structures as described in Embodiment 2, and in this case, the effects described in Embodiment 2 can be further obtained.

Embodiments 1 to 3 described above are merely examples. The present invention is not limited to Embodiments 1 to 3 described above, and can be changed as appropriate.

In Embodiments 1 to 3 described above, the limiting plate unit 80 has the cooling block 85 as a base portion, but the limiting plate unit 80 may not have a cooling function. Even in this case, similar effects to the above-described embodiments can be obtained by using the limiting plate unit covered by an outer surface member in which the outer surfaces of the base portion corresponding to the cooling block 85 are capable of attaching thereto and detaching therefrom.

It is not necessary for the surface shapes of the side surfaces 83 defining the limiting space 82 of the limiting plates 81 in the X axis direction to be a single flat surface, and for example, the surface shape may be a curved surface, any combination of a flat surface and a curved surface, or the like. Such a surface shape is provided on the inner circumferential surface of the tubular body 112.

In Embodiments 1 to 3 described above, the vapor deposition source 60 has a plurality of the nozzle-shaped vapor deposition source openings 61 arranged at equal pitch in the X axis direction, but the shapes of the vapor deposition source openings are not limited to this in the present invention. For example, the vapor deposition source openings may have a slot shape extending in the X axis direction. In this case, a single slot-shaped vapor deposition source opening may be disposed so as to correspond to a plurality of the limiting spaces 82.

If the substrate 10 has a large dimension in the X axis direction, a plurality of vapor deposition units 50 as shown in the above-described embodiments may be arranged at different positions in the X axis direction and in the Y axis direction.

In Embodiments 1 to 3 described above, the substrate 10 is moved relative to the vapor deposition unit 50 that is stationary, but the present invention is not limited thereto. It is sufficient that one of the vapor deposition unit 50 and the substrate 10 is moved relative to the other. For example, it may be possible to fix the position of the substrate 10 and move the vapor deposition unit 50. Alternatively, both the vapor deposition unit 50 and the substrate 10 may be moved.

In Embodiments 1 to 3 described above, the substrate 10 is disposed above the vapor deposition unit 50, but the relative positional relationship between the vapor deposition unit 50 and the substrate 10 is not limited thereto. It may be possible to, for example, dispose the substrate 10 below the vapor deposition unit 50 or dispose the vapor deposition unit 50 and the substrate 10 so as to oppose each other in the horizontal direction.

INDUSTRIAL APPLICABILITY

There is no particular limitation on the fields to which the vapor deposition device and vapor deposition method of the present invention can be applied, and the present invention is preferably used to form light emitting layers for use in organic EL display devices.

DESCRIPTION OF SYMBOLS

10 Substrate
10e Deposition Surface
20 Organic EL Element
23R, 23G, 23B Light Emitting Layer
50 Vapor Deposition Unit
56 Moving Mechanism
60 Vapor Deposition Source
61 Vapor Deposition Source Opening
70 Vapor Deposition Mask
71 Mask Opening
80 Limiting Plate Unit
81 Limiting Plate
82 Limiting Space
83 Side Surface of Limiting Plate
84 Undersurface of Limiting Plate
85 Cooling Block (Base Portion)
85a Main Portion
85b Sub Portion
85h Through Hole
85n Notch
86 Divided Plane
91 Vapor Deposition Particles
110 First Outer Surface Member
110a First Layer
110b Second Layer
110h Through Hole
111 Plate-shaped Member
112 Tubular Body
120 Second Outer Surface Member
120h Through Hole
123 Edge of Through Hole

The invention claimed is:

1. A vapor deposition device for forming a coating film having a predetermined pattern on a substrate, the vapor deposition device comprising:
a vapor deposition unit including a vapor deposition source having at least one vapor deposition source opening, a vapor deposition mask disposed between the at least one vapor deposition source opening and the substrate, and a limiting plate unit that is disposed between the vapor deposition source and the vapor deposition mask and that includes a plurality of limiting plates disposed along a first direction; and
a moving mechanism for moving one of the substrate and the vapor deposition unit relative to the other along a second direction orthogonal to the normal line direction of the substrate and the first direction in a state in which the substrate and the vapor deposition mask are spaced apart at a fixed interval,
wherein the coating film is formed by causing vapor deposition particles that have been discharged from the at least one vapor deposition source opening and that have passed through a limiting space between the limiting plates neighboring in the first direction and a plurality of mask openings formed in the vapor deposition mask to adhere onto the substrate,
the limiting plate unit has a base portion and at least one outer surface member capable of attaching to and detaching from the base portion, and
the at least one outer surface member constitutes at least a portion of surfaces defining the limiting space of the limiting plate unit and a surface of the limiting plate unit opposing the vapor deposition source.

2. The vapor deposition device according to claim 1, wherein the at least one outer surface member constitutes at least a portion of side surfaces defining the limiting space of the plurality of limiting plates.

3. The vapor deposition device according to claim 1, wherein the at least one outer surface member constitutes at least a portion of undersurfaces of the plurality of limiting plates opposing the vapor deposition source.

4. The vapor deposition device according to claim 1, wherein the at least one outer surface member includes a single first outer surface member constituting at least a portion of side surfaces defining the limiting space of the plurality of limiting plates and at least a portion of undersurfaces of the plurality of limiting plates opposing the vapor deposition source.

5. The vapor deposition device according to claim 1, wherein the at least one outer surface member includes a second outer surface member constituting an edge of side surfaces defining the limiting space of the plurality of limiting plates on the side of the vapor deposition mask.

6. The vapor deposition device according to claim 1, wherein a plurality of through holes penetrating the base portion in the normal line direction of the substrate are disposed along the first direction in the base portion, and
the at least one outer surface member includes a first outer surface member covering inner circumferential surfaces of the plurality of through holes and the surface of the base portion opposing the vapor deposition source.

7. The vapor deposition device according to claim 1, wherein the at least one outer surface member has a multilayer structure, and each layer constituting the multilayer structure is removable in order.

8. The vapor deposition device according to claim 1, wherein the base portion is a cooling block for cooling the limiting plate unit.

9. A vapor deposition method comprising a vapor deposition step of forming a coating film having a predetermined pattern on a substrate by causing vapor deposition particles to adhere onto the substrate,
   wherein the vapor deposition step is performed by using the vapor deposition device according to claim 1.

10. The vapor deposition device according to claim 4, wherein the first outer surface member is capable of attaching to and detaching from the base portion without moving in the normal line direction of the substrate.

11. The vapor deposition device according to claim 5, wherein the second outer surface member protrudes toward the limiting space.

12. The vapor deposition device according to claim 5, wherein the second outer surface member covers the surface of the base portion opposing the vapor deposition mask.

13. The vapor deposition device according to claim 6, wherein the base portion is dividable along a division plane passing across the plurality of through holes and parallel to the first direction.

14. The vapor deposition method according to claim 9, wherein the coating film is a light emitting layer for an organic EL element.

\* \* \* \* \*